US008345433B2

(12) United States Patent
White et al.

(10) Patent No.: US 8,345,433 B2
(45) Date of Patent: Jan. 1, 2013

(54) HETEROGENEOUS ORGANIC LAMINATE STACK UPS FOR HIGH FREQUENCY APPLICATIONS

(75) Inventors: George E. White, Marietta, GA (US); Sidharth Dalmia, Norcross, GA (US); Venkatesh Sundaram, Norcross, GA (US); Madhavan Swaminathan, Marietta, GA (US)

(73) Assignee: AVX Corporation, Fountain Inn,, SC (US)

( * ) Notice: Subject to any disclaimer, the term of this patent is extended or adjusted under 35 U.S.C. 154(b) by 991 days.

(21) Appl. No.: 11/177,508

(22) Filed: Jul. 8, 2005

(65) Prior Publication Data
US 2006/0017152 A1    Jan. 26, 2006

Related U.S. Application Data

(60) Provisional application No. 60/586,200, filed on Jul. 8, 2004.

(51) Int. Cl.
*H05K 1/18*    (2006.01)
(52) U.S. Cl. ........................................ 361/761; 361/792
(58) Field of Classification Search .......... 361/761–764, 361/792–795
See application file for complete search history.

(56) References Cited

U.S. PATENT DOCUMENTS

| | | |
|---|---|---|
| 4,745,215 A | 5/1988 | Cox et al. |
| 4,824,381 A | 4/1989 | Hertzberg et al. |
| 5,106,461 A | 4/1992 | Volfson et al. |
| 5,162,257 A | 11/1992 | Yung |
| 5,247,377 A | 9/1993 | Omeis et al. |
| 5,270,493 A | 12/1993 | Inoue et al. |
| 5,323,128 A | 6/1994 | Ishizaki et al. |

(Continued)

FOREIGN PATENT DOCUMENTS
EP    0 506 476    3/1992
(Continued)

OTHER PUBLICATIONS

Alvin, L. S. Loke, et al., "Evaluation of Copper Penetration in Low-γ Polymer Dielectrics by Bias-Temperature Stress," MRS Spring Meeting, Symposium N/o, Paper O4.4, San Francisco, CA, Apr. 7, 1999.

(Continued)

*Primary Examiner* — Jeremy Norris
(74) *Attorney, Agent, or Firm* — Dority & Manning, P.A.

(57) ABSTRACT

Organic laminate stack ups are disclosed for a variety of applications, including high frequency RF applications. One or more inner core layers may be disposed between outer layers along with bondply or prepreg layers as needed. Discrete devices, including surface mount components and flip chips, may be embedded within the organic laminate stack up structures. The embedding of the discrete devices, which may be active or passive devices, may be in the form of a layer of bondply or prepreg encapsulating the discrete devices. In addition or in the alternative, cavities may be formed in at least the outer layers for housing discrete devices, which include surface mount components, flip chips, and wire bonded integrated circuits. A variety of caps may be utilized to seal the cavities. Further, shielding may be provided for the organic laminate stack up structure, including through a wall of vias or a plated trench cut along at least one side of the stack up structure. Each stack up structure may be packaged in a variety of ways, including as a surface mount component, ball grid array, or land grid array.

8 Claims, 20 Drawing Sheets

U.S. PATENT DOCUMENTS

| | | | |
|---|---|---|---|
| 5,329,695 A | | 7/1994 | Traskos et al. |
| 5,349,314 A | | 9/1994 | Shimizu et al. |
| 5,373,271 A | | 12/1994 | Hirai et al. |
| 5,384,434 A | | 1/1995 | Mandai et al. |
| 5,396,201 A | | 3/1995 | Ishizaki et al. |
| 5,401,913 A | | 3/1995 | Gerber et al. |
| 5,416,454 A | | 5/1995 | McVeety |
| 5,450,290 A | | 9/1995 | Boyko et al. |
| 5,475,606 A | * | 12/1995 | Muyshondt et al. .......... 174/257 |
| 5,497,337 A | | 3/1996 | Ponnapalli et al. |
| 5,517,751 A | | 5/1996 | Bross et al. |
| 5,521,564 A | | 5/1996 | Kaneko et al. |
| 5,532,667 A | | 7/1996 | Haertling et al. |
| 5,545,916 A | | 8/1996 | Koullias |
| 5,559,360 A | | 9/1996 | Chiu et al. |
| 5,610,433 A | | 3/1997 | Merrill et al. |
| 5,635,892 A | | 6/1997 | Ashby et al. |
| 5,654,681 A | | 8/1997 | Ishizaki et al. |
| 5,668,511 A | | 9/1997 | Furutani et al. |
| 5,679,414 A | | 10/1997 | Akashi et al. |
| 5,703,544 A | | 12/1997 | Hays, III |
| 5,716,663 A | | 2/1998 | Capote et al. |
| 5,719,354 A | | 2/1998 | Jester et al. |
| 5,719,539 A | | 2/1998 | Ishizaki et al. |
| 5,720,898 A | | 2/1998 | Nohira et al. |
| 5,739,193 A | | 4/1998 | Walpita et al. |
| 5,770,986 A | | 6/1998 | Tonegawa et al. |
| 5,801,100 A | | 9/1998 | Lee et al. |
| 5,818,313 A | | 10/1998 | Estes et al. |
| 5,828,555 A | * | 10/1998 | Itoh ................ 361/784 |
| 5,844,299 A | | 12/1998 | Merrill et al. |
| 5,917,244 A | | 6/1999 | Lee et al. |
| 5,955,931 A | | 9/1999 | Kaneko et al. |
| 5,994,771 A | * | 11/1999 | Sasaki et al. ........... 257/700 |
| 5,999,243 A | | 12/1999 | Kameyama et al. |
| 6,005,197 A | | 12/1999 | Kola et al. |
| 6,008,102 A | | 12/1999 | Alford et al. |
| 6,021,050 A | | 2/2000 | Ehman et al. |
| 6,026,286 A | | 2/2000 | Long |
| 6,031,727 A | | 2/2000 | Duesman et al. |
| 6,040,226 A | | 3/2000 | Wojnarowski et al. |
| 6,051,289 A | | 4/2000 | Tsujimoto et al. |
| 6,079,100 A | | 6/2000 | Farquhar et al. |
| 6,093,599 A | | 7/2000 | Lee et al. |
| 6,114,925 A | | 9/2000 | Lo |
| 6,127,905 A | | 10/2000 | Horie |
| 6,153,290 A | | 11/2000 | Sunahara |
| 6,166,799 A | | 12/2000 | Kameyama et al. |
| 6,171,716 B1 | | 1/2001 | Sasaki et al. |
| 6,177,853 B1 | | 1/2001 | Nagatomi et al. |
| 6,181,278 B1 | | 1/2001 | Kakimoto et al. |
| 6,191,666 B1 | | 2/2001 | Sheen |
| 6,191,669 B1 | | 2/2001 | Shigemura |
| 6,214,525 B1 | * | 4/2001 | Boyko et al. ............ 430/313 |
| 6,225,696 B1 | | 5/2001 | Hathaway et al. |
| 6,249,962 B1 | | 6/2001 | Bergstedt |
| 6,255,714 B1 | | 7/2001 | Kossives et al. |
| 6,259,037 B1 | | 7/2001 | Feilchenfeld et al. |
| 6,259,148 B1 | | 7/2001 | Bartush et al. |
| 6,261,872 B1 | | 7/2001 | Hathaway et al. |
| 6,281,430 B1 | | 8/2001 | Lupo et al. |
| 6,287,931 B1 | | 9/2001 | Chen |
| 6,303,423 B1 | | 10/2001 | Lin |
| 6,333,469 B1 | | 12/2001 | Inoue et al. |
| 6,380,608 B1 | | 4/2002 | Bentley |
| 6,395,374 B1 | | 5/2002 | McAndrew et al. |
| 6,421,225 B2 | | 7/2002 | Bergstedt |
| 6,445,266 B1 | | 9/2002 | Nagatomi et al. |
| 6,449,168 B1 | * | 9/2002 | Soderholm ................ 361/761 |
| 6,492,886 B1 | | 12/2002 | Kushitani et al. |
| 6,528,732 B1 | | 3/2003 | Okubora et al. |
| 6,552,265 B1 | * | 4/2003 | Bergstedt et al. .......... 174/535 |
| 6,559,798 B1 | | 5/2003 | Marumoto et al. |
| 6,583,687 B2 | | 6/2003 | Nosaka |
| 6,586,686 B1 | | 7/2003 | Enomoto et al. |
| 6,613,413 B1 | * | 9/2003 | Japp et al. ................ 428/131 |
| 6,625,037 B2 | | 9/2003 | Nakatani et al. |
| 6,630,630 B1 | | 10/2003 | Maezawa et al. |
| 6,713,162 B2 | | 3/2004 | Takaya et al. |
| 6,759,600 B2 | | 7/2004 | Koyama et al. |
| 6,865,804 B2 | * | 3/2005 | Youker et al. .............. 29/846 |
| 2001/0004228 A1 | | 6/2001 | Hirai et al. |
| 2001/0016980 A1 | | 8/2001 | Bergstedt |
| 2001/0050599 A1 | | 12/2001 | Maekawa et al. |
| 2002/0008301 A1 | | 1/2002 | Liou et al. |
| 2002/0048930 A1 | | 4/2002 | Lin |
| 2002/0064701 A1 | | 5/2002 | Hand et al. |
| 2002/0064922 A1 | | 5/2002 | Lin |
| 2002/0074158 A1 | | 6/2002 | St. Lawrence et al. |
| 2002/0075106 A1 | * | 6/2002 | Okubora et al. ............ 333/247 |
| 2002/0076538 A1 | | 6/2002 | St. Lawrence et al. |
| 2002/0081443 A1 | | 6/2002 | Connelly et al. |
| 2002/0157864 A1 | | 10/2002 | Koyama et al. |
| 2002/0158305 A1 | | 10/2002 | Dalmia et al. |
| 2002/0172021 A1 | | 11/2002 | Seri et al. |
| 2002/0195270 A1 | | 12/2002 | Okubora et al. |
| 2004/0000425 A1 | | 1/2004 | White et al. |
| 2004/0000701 A1 | | 1/2004 | White et al. |
| 2004/0000968 A1 | | 1/2004 | White et al. |
| 2004/0034489 A1 | | 2/2004 | Ogino et al. |
| 2004/0113752 A1 | | 6/2004 | Schuster |
| 2004/0264156 A1 | * | 12/2004 | Ajioka et al. ............ 361/818 |
| 2005/0248418 A1 | | 11/2005 | Govind et al. |
| 2006/0017152 A1 | | 1/2006 | White et al. |
| 2006/0092079 A1 | | 5/2006 | de Rochemont |
| 2007/0257843 A1 | | 11/2007 | Gooshchin |

FOREIGN PATENT DOCUMENTS

| | | |
|---|---|---|
| EP | 0 510 971 | 4/1992 |
| EP | 0 645 952 | 9/1994 |
| EP | 1 235 235 | 2/2002 |
| EP | 1 411 553 | 4/2004 |
| JP | 09 130103 | 10/1995 |
| WO | WO 01/95679 | 12/2001 |
| WO | WO 01/97582 | 12/2001 |

OTHER PUBLICATIONS

Charles, H. K., "Packaging with Multichip Modules," 1992 IEEE/CHMT Int'l Electronics Manufacturing Technology Symposium, pp. 206-210.

Dalmia, S. et al., "Modeling RF Passive Circuits Using Coupled Lines and Scalable Models," 2001 Electronic Components and Technology Conference, pp. 816-823.

Hong, J. S. et al., "Microstrip Filters for RF/Microwave Applications," Wiley-Interscience Publication, 2001, pp. 121-159.

Matijasevic, G. et al., "MCM-L Substrates Fabricated Using Patterned TLPS Conductive Composites," 1997, International Conference on Multichip Modules, Apr. 2, 1997, pp. 64-69.

Min, S. H. et al., "Design, Fabircation, Measurement and Modeling of Embedded Inductors in Laminate Technology," ASME International Electronic Packaging Technical Conference and Exhibition, Jul. 8-13, 2001, pp. 1-5.

Patent Abstracts of Japan vol. 1995, No. 9, Oct. 31, 1995.

Son, M. H. et al., "Low-Cost Realization of ISM Band Pass Filters Using Integrated Combine Structures," 2000, (4 pages).

Wang, et al., "A Full-Wave Analysis Model for Uniplanar Circuits with Lumped Elements," IEEE Transactions on Microwave Theory and Techniques, vol. 51, No. 1, Jan. 2003.

www.sbir.gsfc.nasa.gov/SBIR/successes/ss/110text.html; Liquid Crystal Polymers for Printed Wiring Boards.

www.stneasy.org.tmp; Display from INSPEC; Taoka, M., Kanetaka, T., Dec. 4, 2002.

www.yamaichi.us/yflex.html; Flexible Printed Circuit.

* cited by examiner

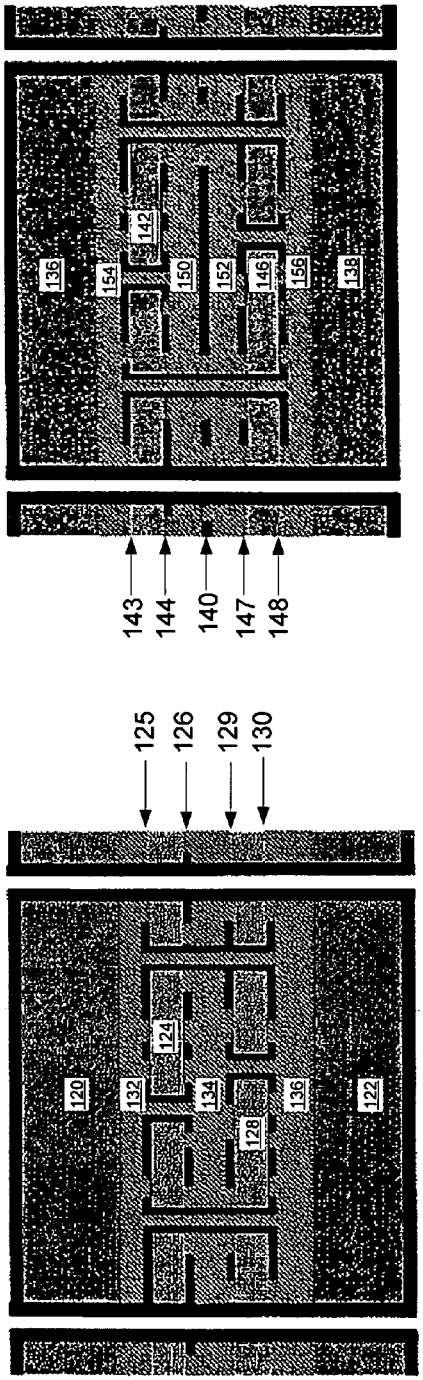
FIG. 1C
FIG. 1B
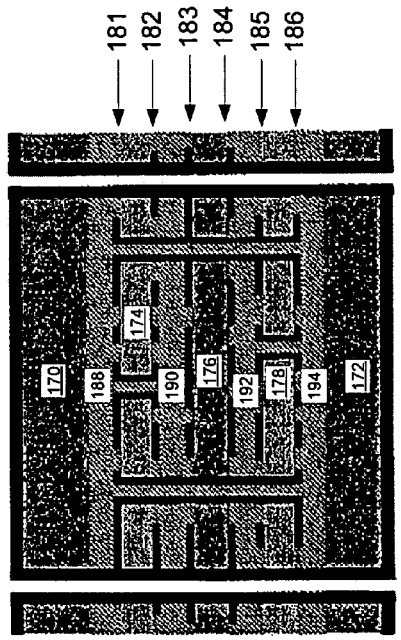
FIG. 1D

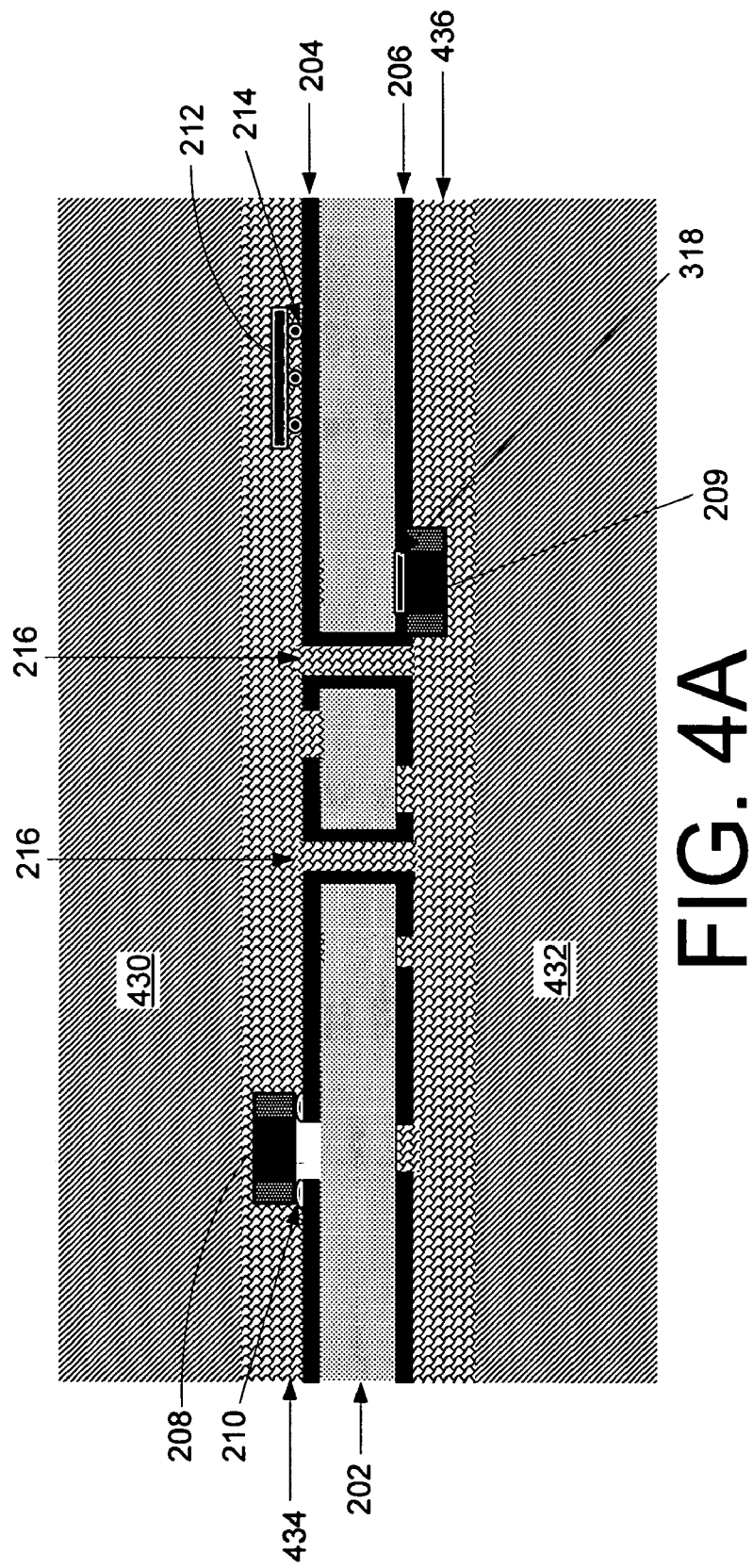

HETEROGENEOUS ORGANIC LAMINATE STACK UPS FOR HIGH FREQUENCY APPLICATIONS

RELATED APPLICATIONS

The present application claims priority to U.S. Provisional Patent Application Ser. No. 60/586,200 filed Jul. 8, 2004, which is hereby incorporated by reference as if set forth fully herein.

BACKGROUND OF THE INVENTION

1. Field of the Invention

Aspects of the present invention relate generally to integrated devices and more particularly to organic laminate stack ups.

2. Description of the Related Art

Today typical printed circuit board assembly processes can be categorized into two modes of assembly: a) through hole assembly and b) surface mount assembly (SMA). While both are used widely, SMA is the generally preferred assembly method when an objective is to reduce size and increase performance. Using SMA processes, one can readily assemble both active and passive components, which may be generally referred to as surface mount devices (SMD). Surface mount active and passive components typically have been placed on the outermost layer of a printed circuit board. The surface mounted components can be either on the top side, bottom side, or both on the top and bottom of the printed circuit board. The component attachment is typically accomplished by printing solder paste on the surface of the printed circuit board using a stencil that is typically held down by a vacuum source mated against the printed circuit board. The solder paste is screened through openings in the stencil onto pads of the printed circuit board. After application of the solder paste the surface mount components are then placed onto the soldered pasted sites using a pick and place machine. Pick and place machines, which are almost always automated, typically use a vision system to ensure appropriate alignment and accurate placement of surface mount components. Upon placement of the components, the entire printed circuit board assembly with the placed components is now reflowed in an appropriate oven to achieve a reliable interconnect between the printed circuit board and the components.

The above-described process, although widely used to reduce the overall size of the printed circuit board assembly, still has many challenges. These challenges include microminiaturization, reliability, and performance. As system speeds and frequencies increase, it becomes imperative to minimize parasitics. For digital based systems, this equates to delay and for RF (radio frequency) based systems, this translates into reduction in gain. In any case, system performance suffers.

Thus, it may be desirable to reduce interconnect lengths, improve reliability, reduce system size, reduce costs, and improve flexibility in design.

BRIEF DESCRIPTION OF THE INVENTION

Embodiments of the present invention disclose materials stack up, sequences, and process fabrication techniques for embedding active and passive discrete devices within one or more organic layers and/or cavities. The materials stack up coupled with novel process features allows for the generation of new topologies that result in reduced layer counts and increased component density, thereby resulting in very high component densities.

According to an embodiment of the invention, there is a multi-layer organic stack up. The multi-layer organic stack up includes a first organic layer, a circuitized conductive layer on a surface of the first organic layer for forming passive circuits, a second organic layer positioned opposite the circuitized conductive layer, where the second organic layer may be coupled to the first organic layer with a layer of prepreg, and a cavity defined by one or more walls formed by at least one of the second organic and the prepeg layer, where the cavity exposes at least a portion of the circuitized conductive layer. In addition, a discrete device may be attached to the circuitized conductive layer in the cavity.

According to another embodiment of the invention, there is a method of fabricating multi-layer organic stack ups. The method includes providing an inner core layer, where the inner core layer includes at least one conductive layer that includes a first passive circuit formed therein, attaching at least one discrete device to the conductive layer, providing a layer of prepreg on the inner core layer, where the layer of prepeg and the inner core layer encapsulate the discrete device, and providing an outer layer on the layer of prepreg opposite the inner core layer.

According to yet another embodiment of the invention, there is a multi-layer organic stack up. The multi-layer organic stack up includes an inner organic layer, where inner organic layer comprises at least one conductive layer for forming a first passive circuit thereon, at least one discrete device coupled to the conductive layer, a layer of prepreg on the inner organic layer, where the layer of prepeg and the inner organic layer encapsulate the discrete device, and an outer organic layer on the layer of prepreg opposite the inner organic layer.

BRIEF DESCRIPTION OF THE DRAWINGS

Having thus described aspects of the invention in general terms, reference will now be made to the accompanying drawings, which are not necessarily drawn to scale, and wherein:

FIGS. 1A-1D illustrate exemplary stack up structures according to embodiments of the present invention.

Figure 2:
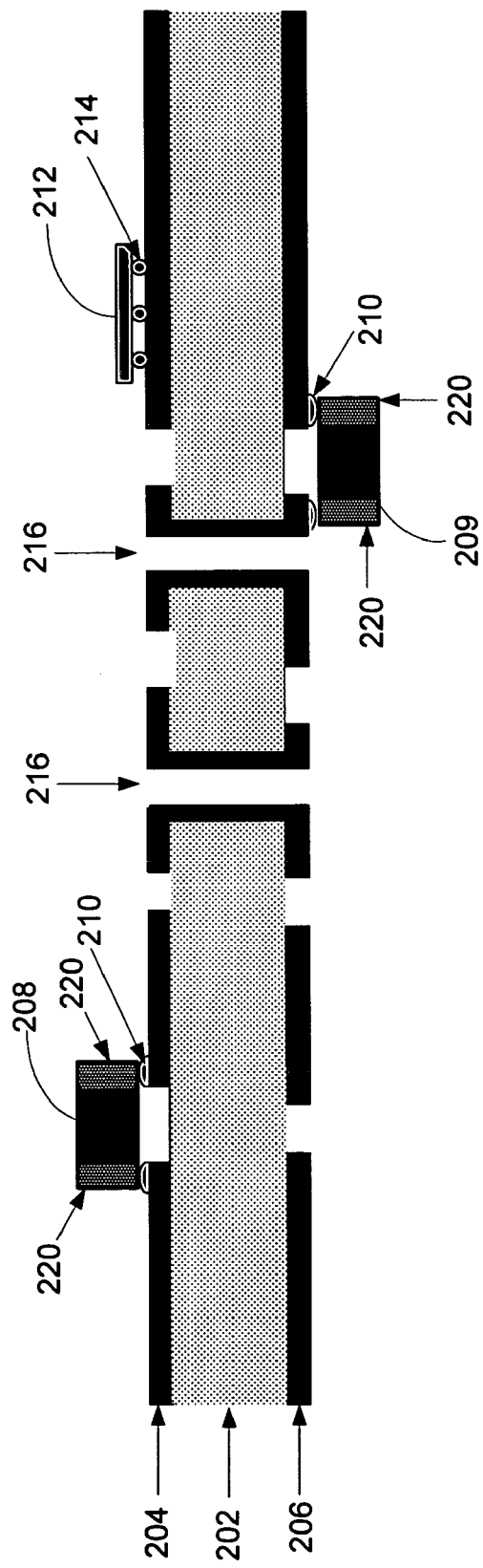

FIG. 2 illustrates the attachment of surface mount components via solder, alloy, or conductive paste on an inner layer of organic metal clad laminate material.

Figure 3:
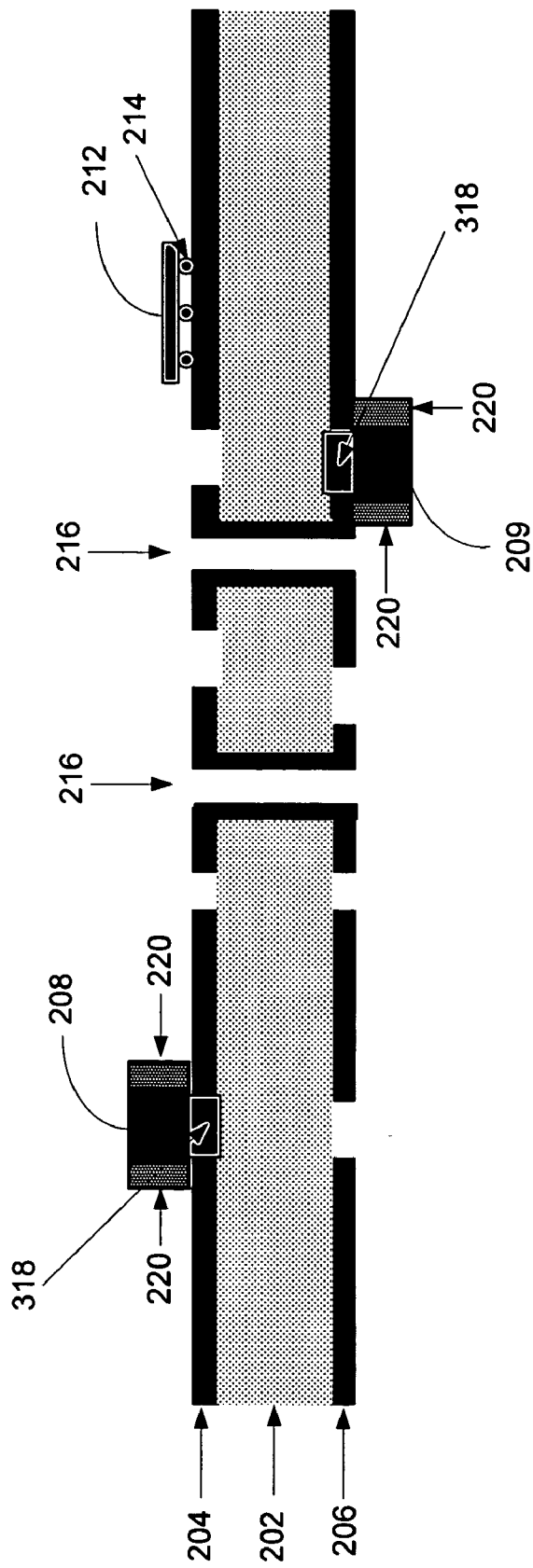

FIG. 3 illustrates the attachment of surface mount components utilizing non-conductive adhesives on an inner layer of organic metal clad laminate material.

Figure 4B:
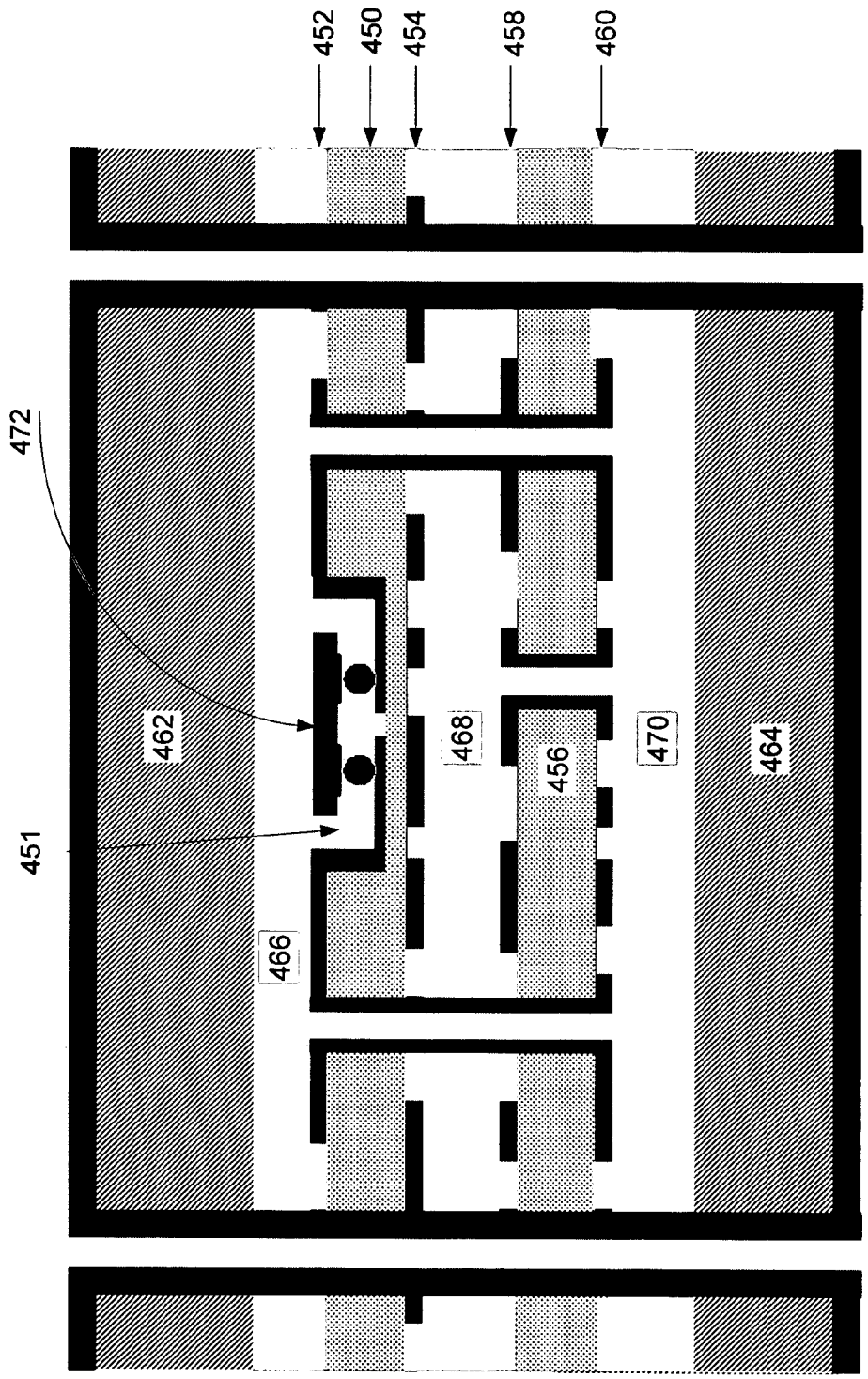

FIGS. 4A and 4B illustrate exemplary stack up structures with embedded devices.

Figure 5A:
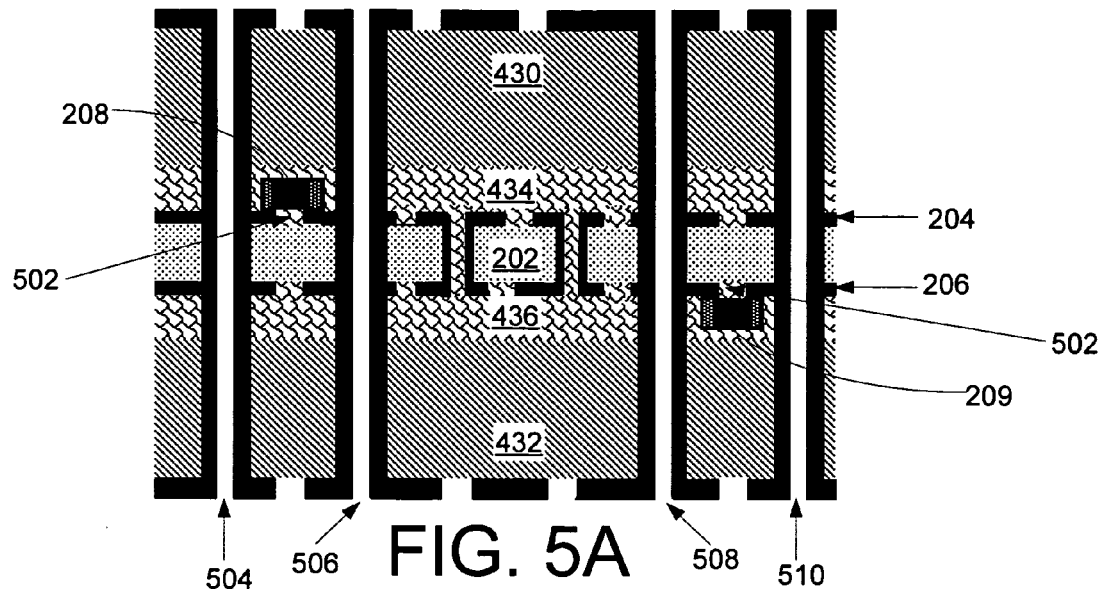
Figure 5B:
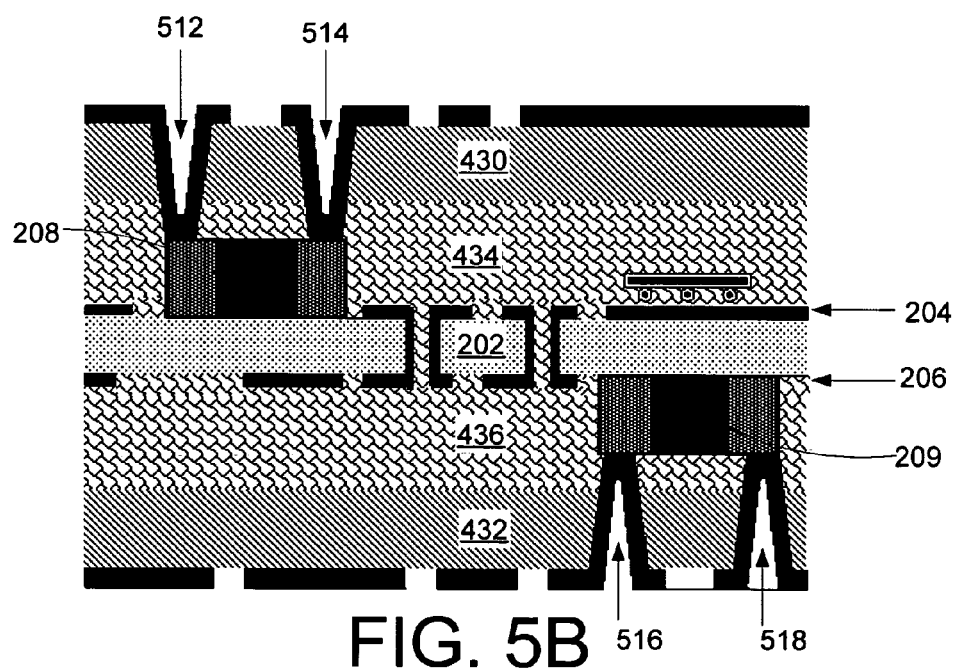

FIGS. 5A and 5B illustrate connections to the embedded surface mount devices.

Figure 6A:
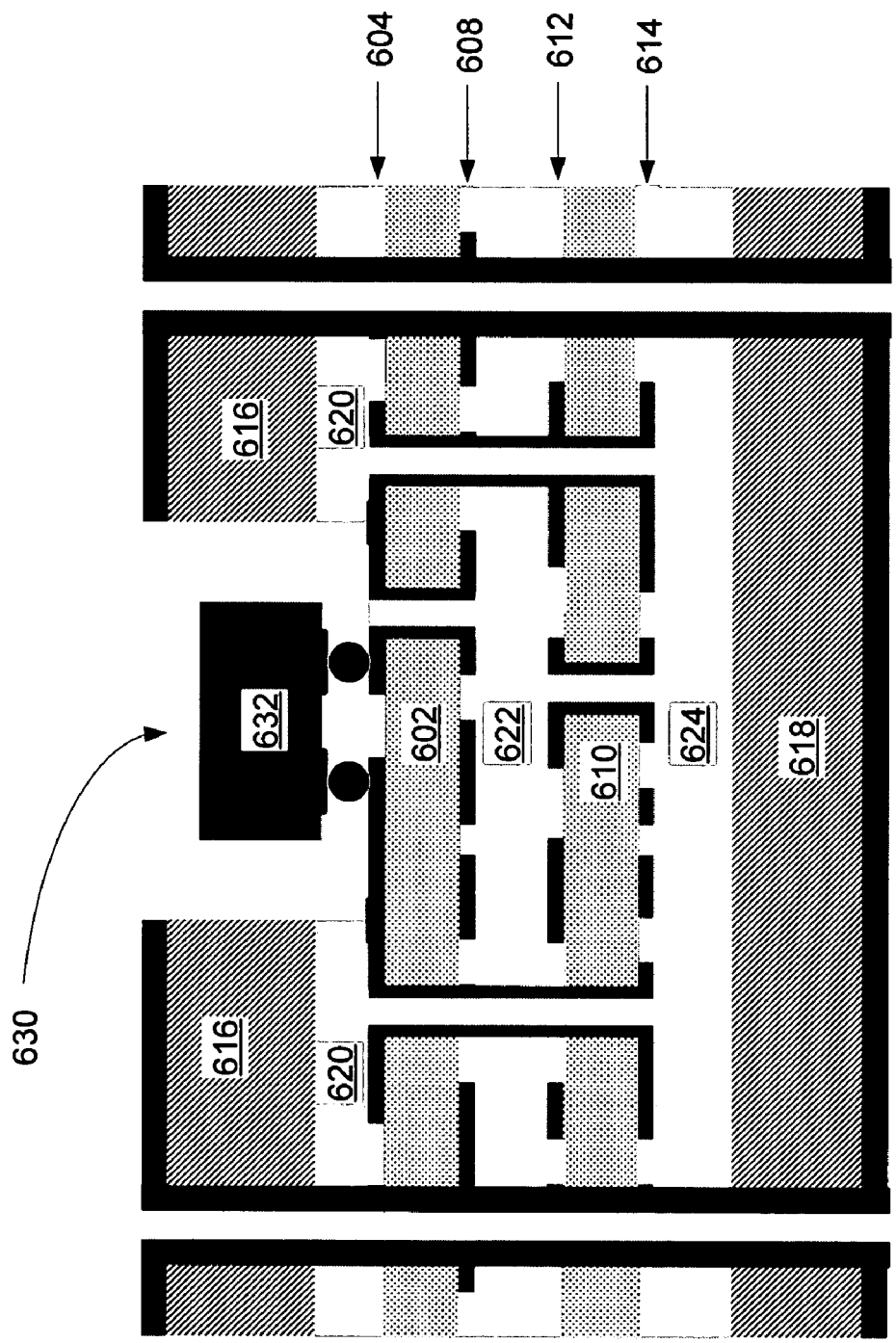
Figure 6B:
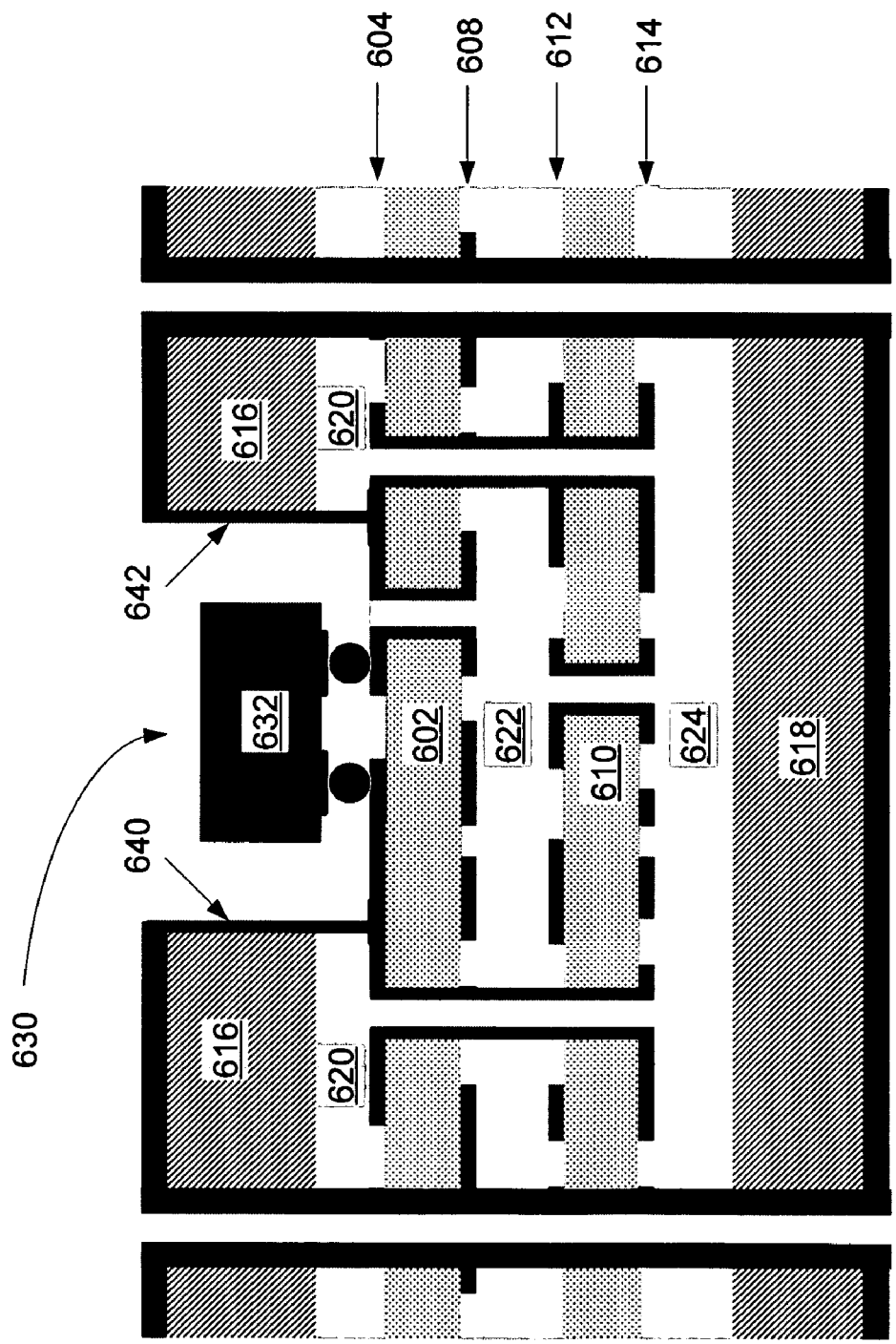

FIGS. 6A and 6B illustrates the formation of a cavity in a multi-layer structure with a surface mount component in the cavity.

Figure 7A:
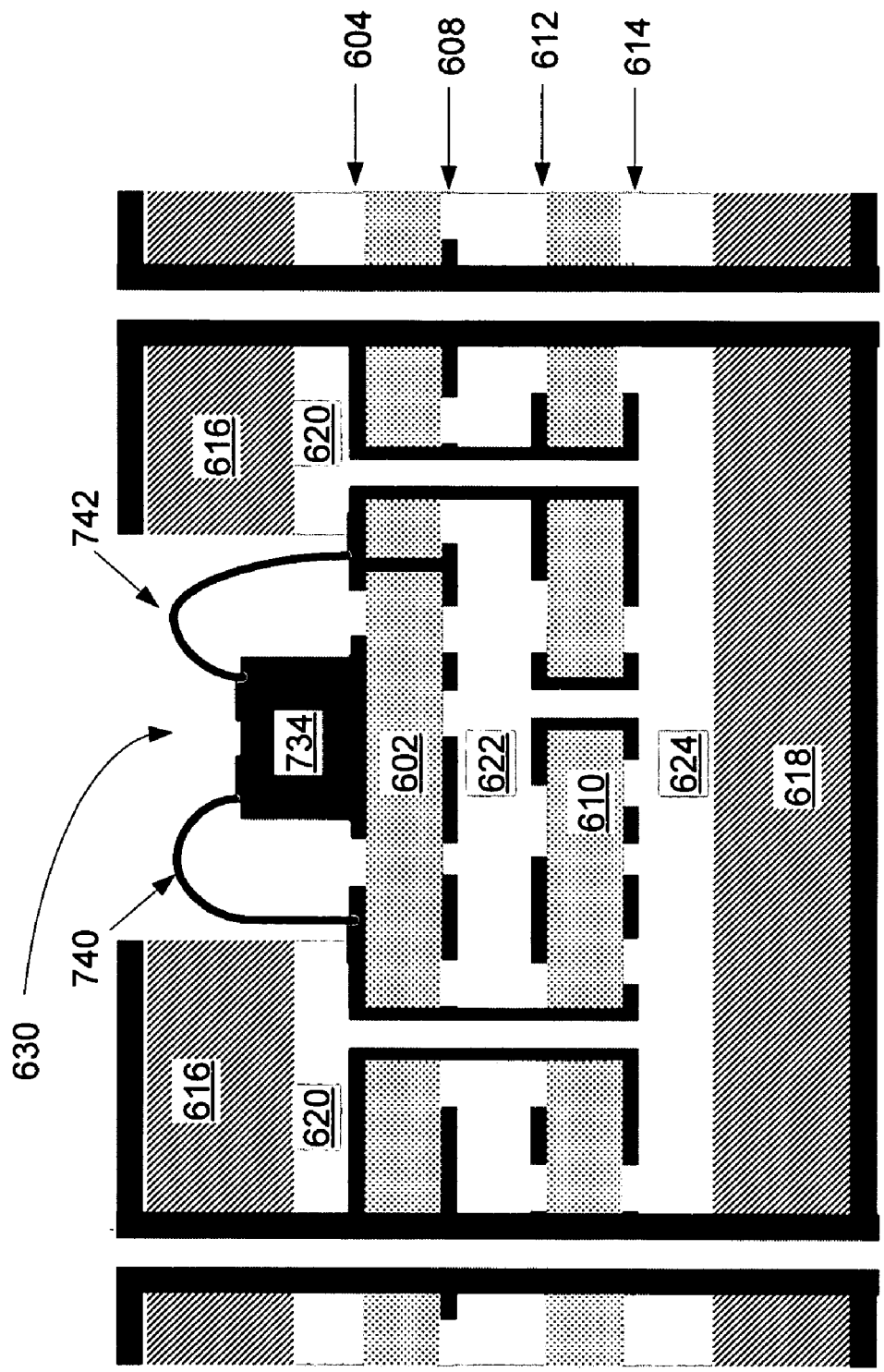
Figure 7B:
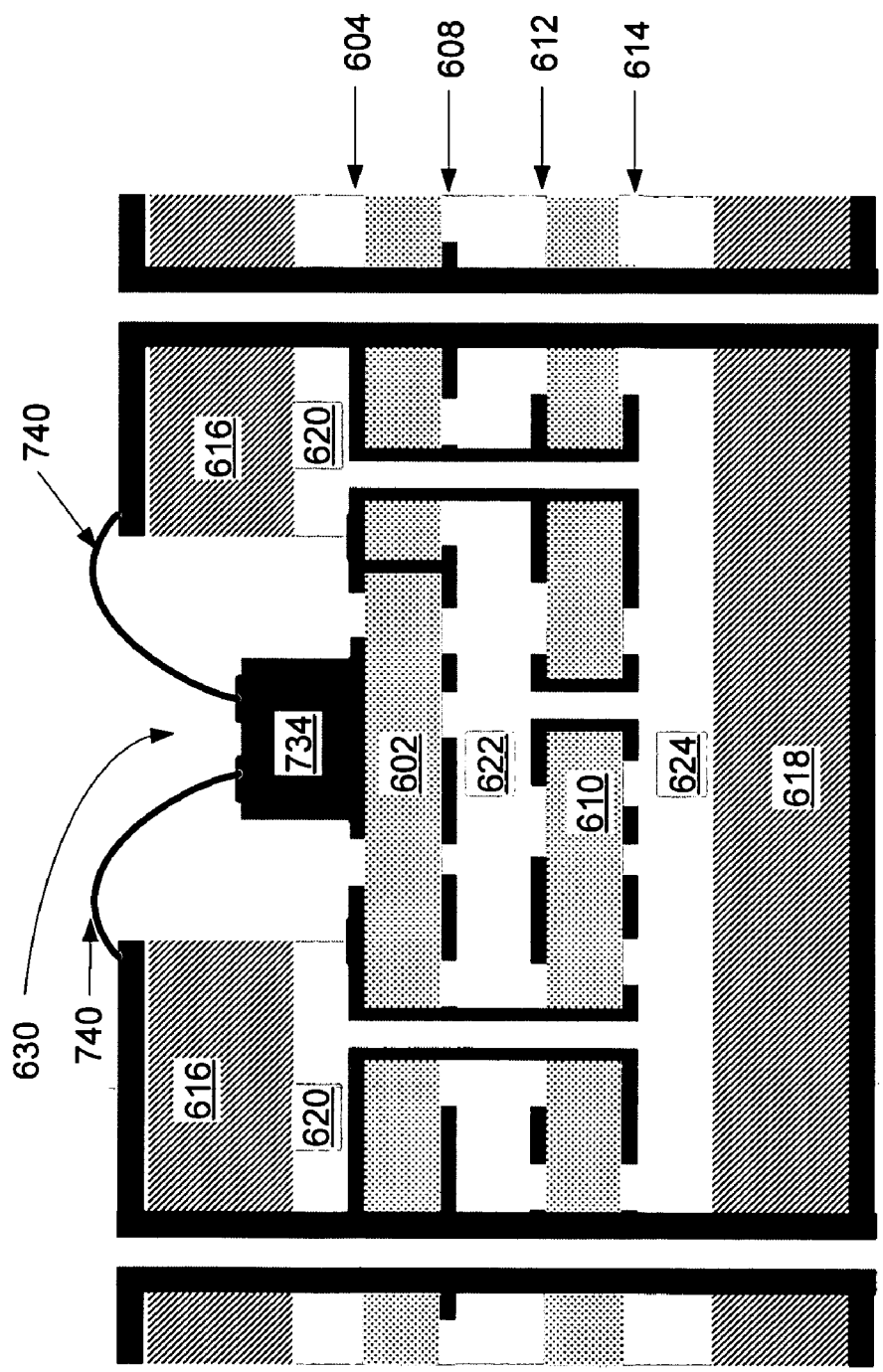

FIGS. 7A and 7B illustrate the formation of a cavity in a multi-layer structure with a wire bonded integrated circuit in the cavity.

Figure 8:
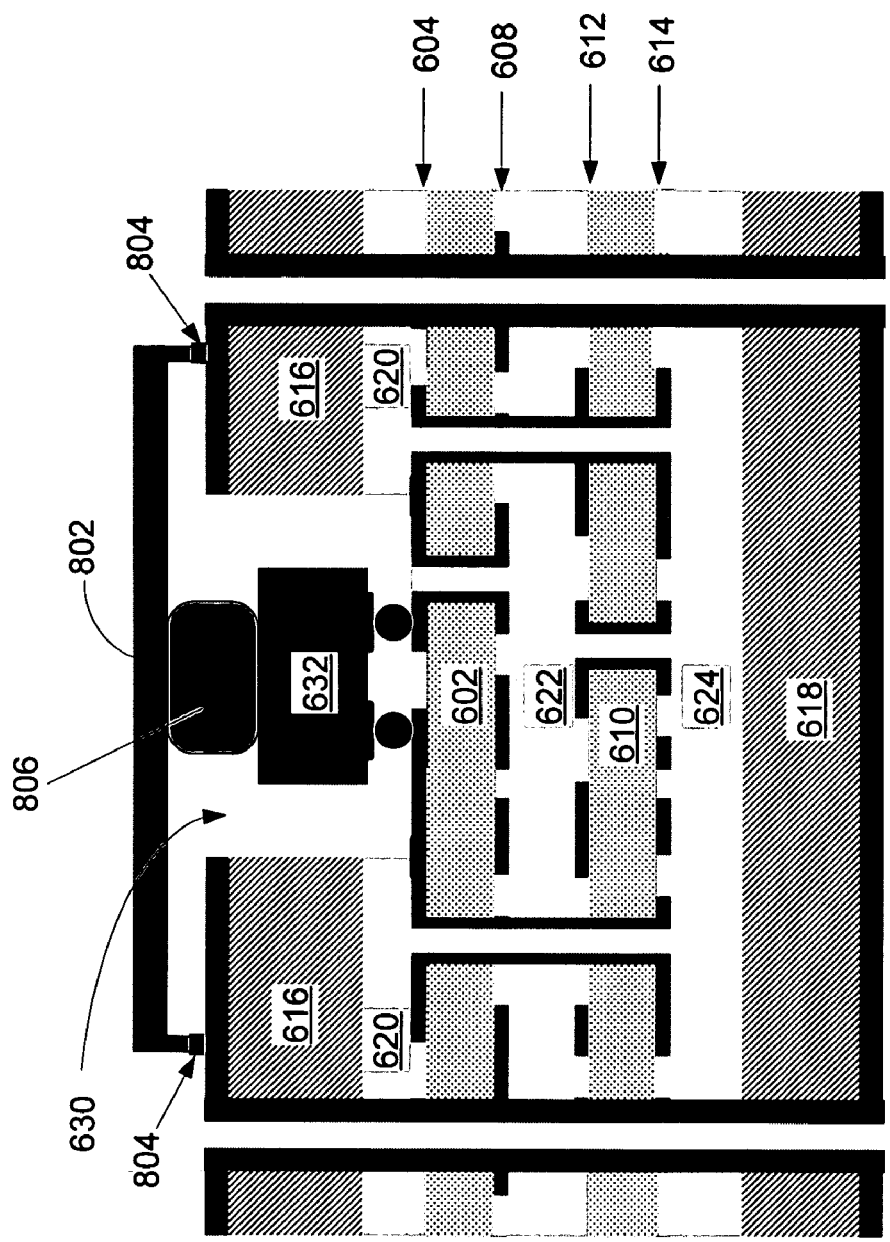

FIG. 8 illustrates the sealing of a cavity with a metal cap in a multi-layer structure.

Figure 9:
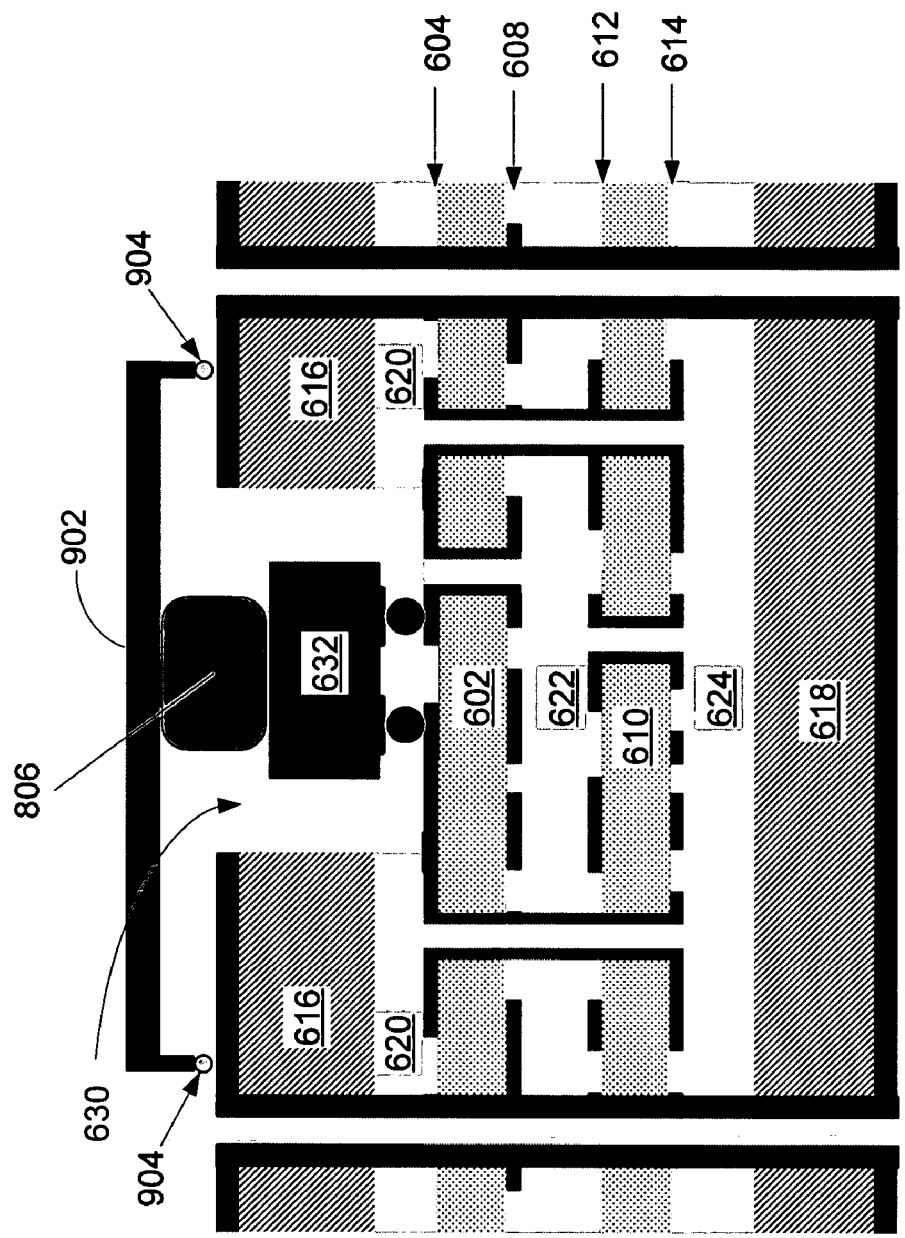

FIG. 9 illustrates the sealing of a cavity with a cap with solder preforms in a multi-layer structure.

Figure 10:
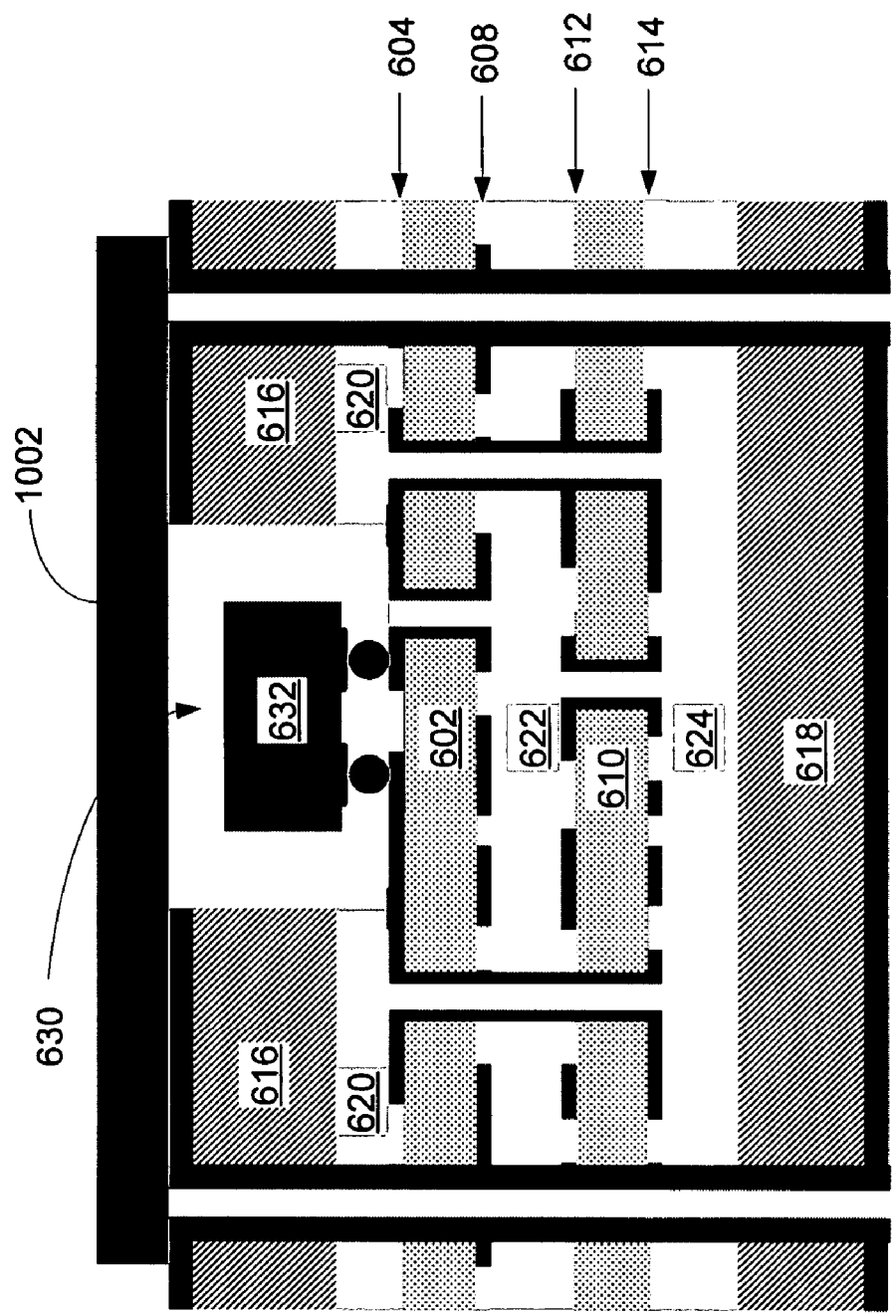

FIG. 10 illustrates the sealing of a cavity with an encapsulant or encapsulate in a multi-layer structure.

Figure 11:
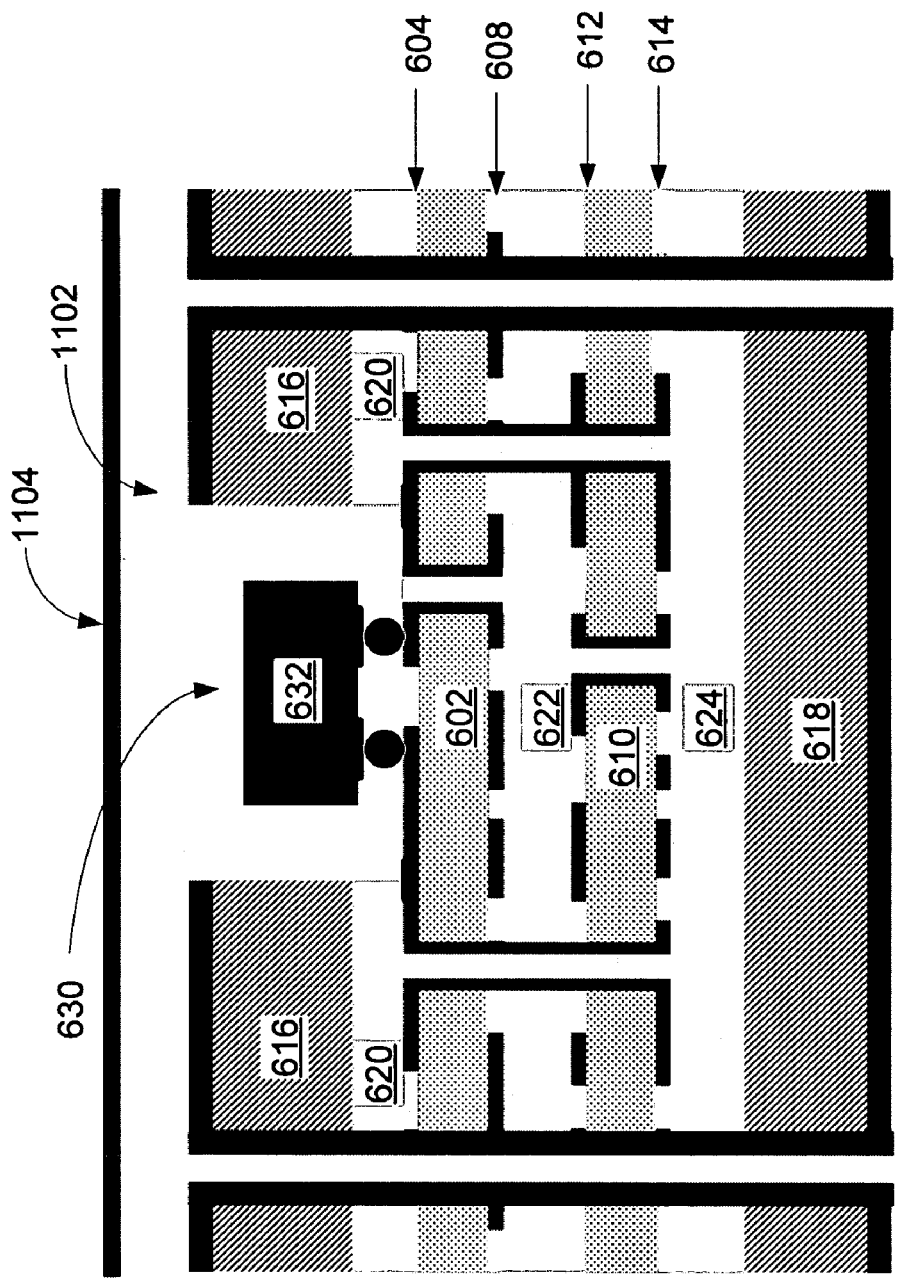

FIG. 11 illustrates the sealing of a cavity with a metal clad laminate in a multi-layer structure.

Figure 12:
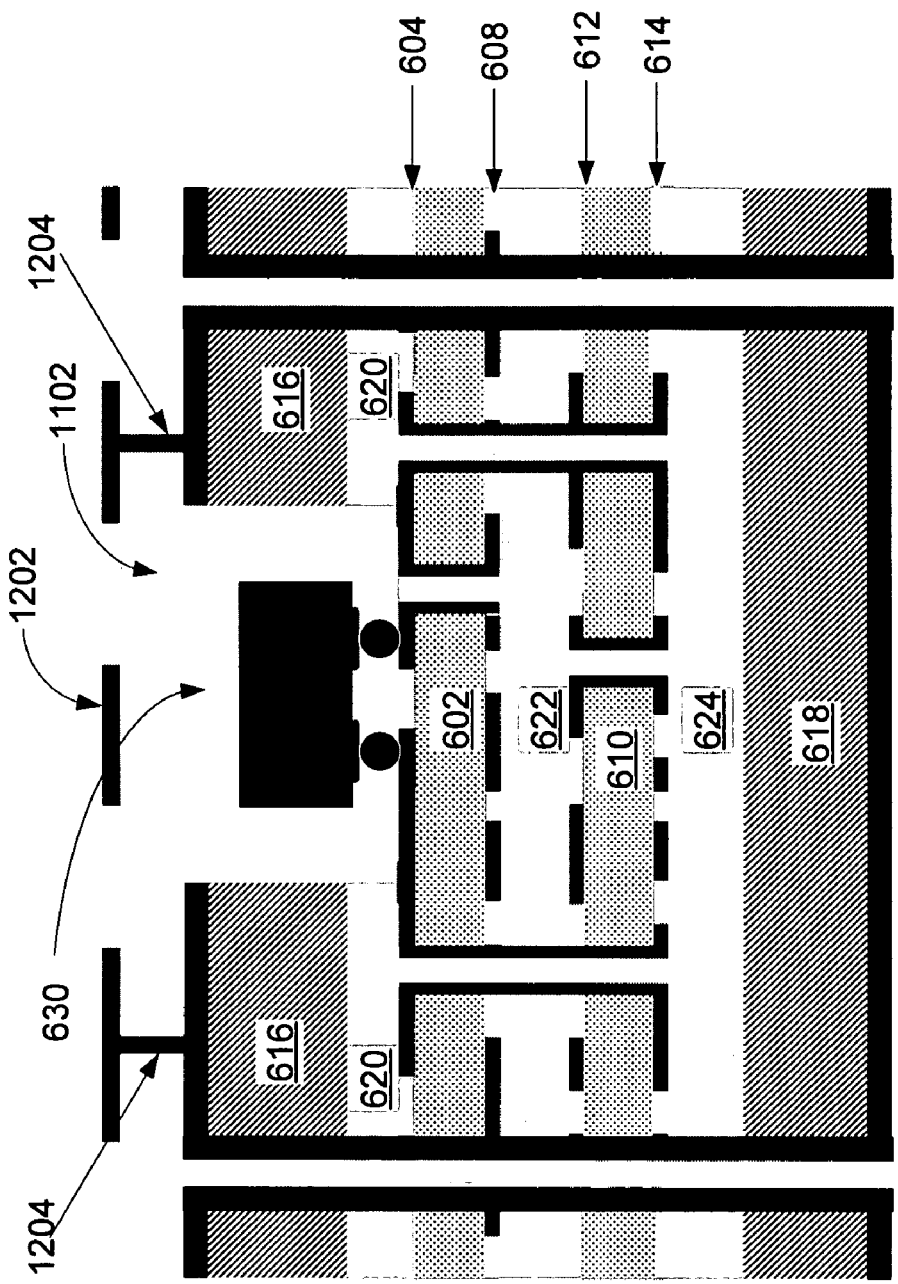

FIG. 12 illustrates circuitization and interconnects of the metal clad laminate shown in FIG. 11.

Figure 13:
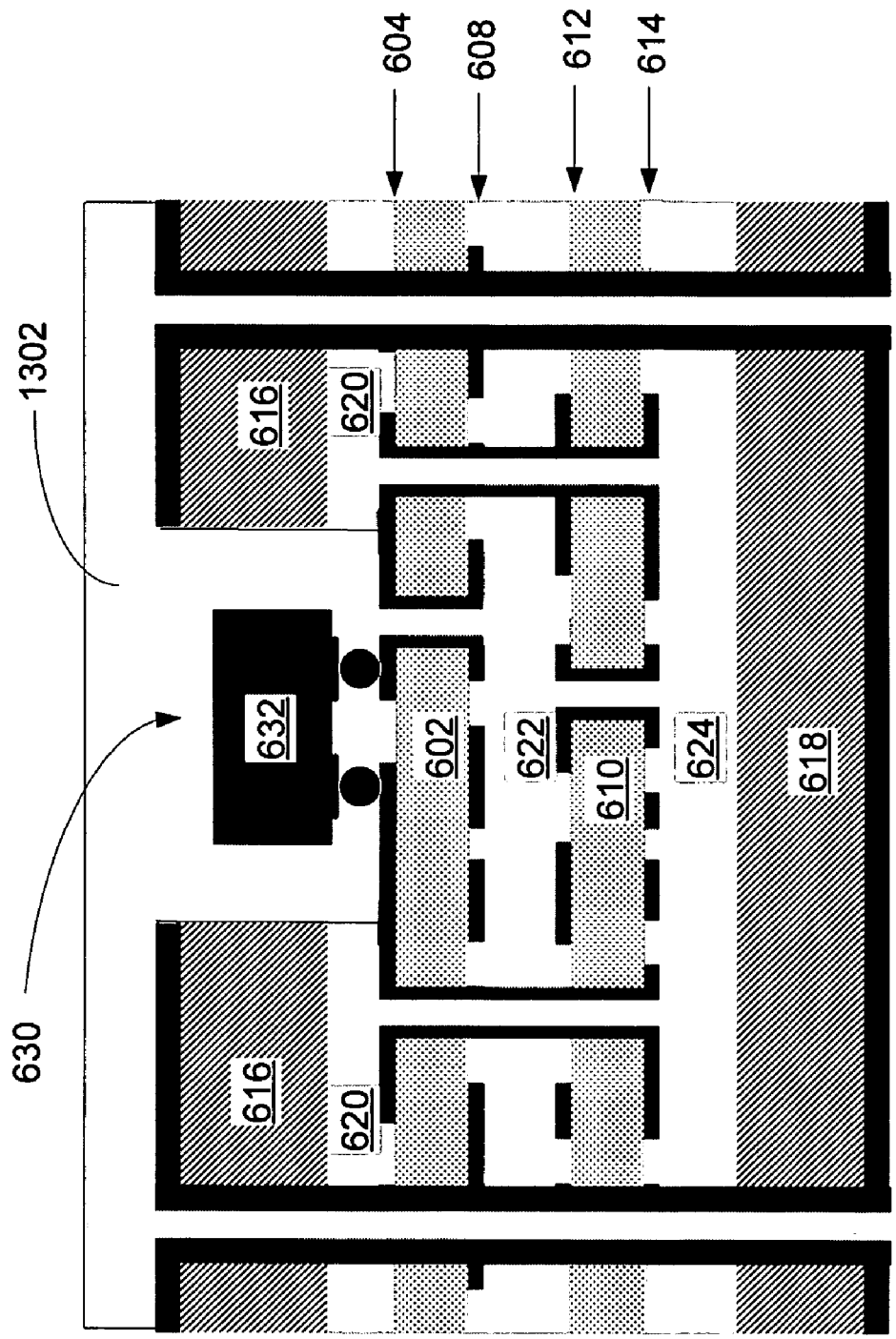

FIG. 13 illustrates the sealing of a cavity with a fast flow laminate in a multi-layer structure.

Figure 14:
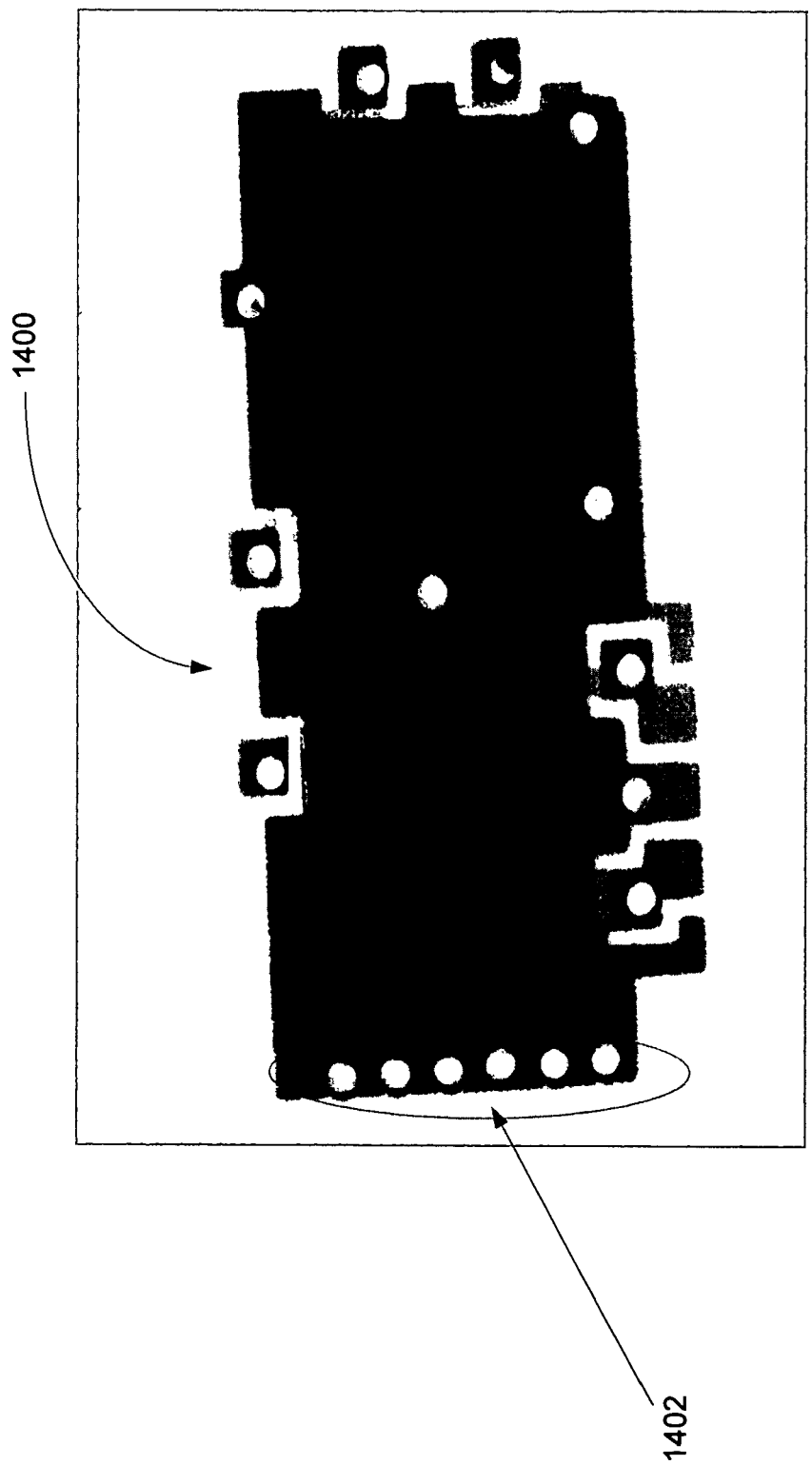

FIG. 14 illustrates a top perspective view of a device with shielding by a wall or array of vias.

Figure 15:
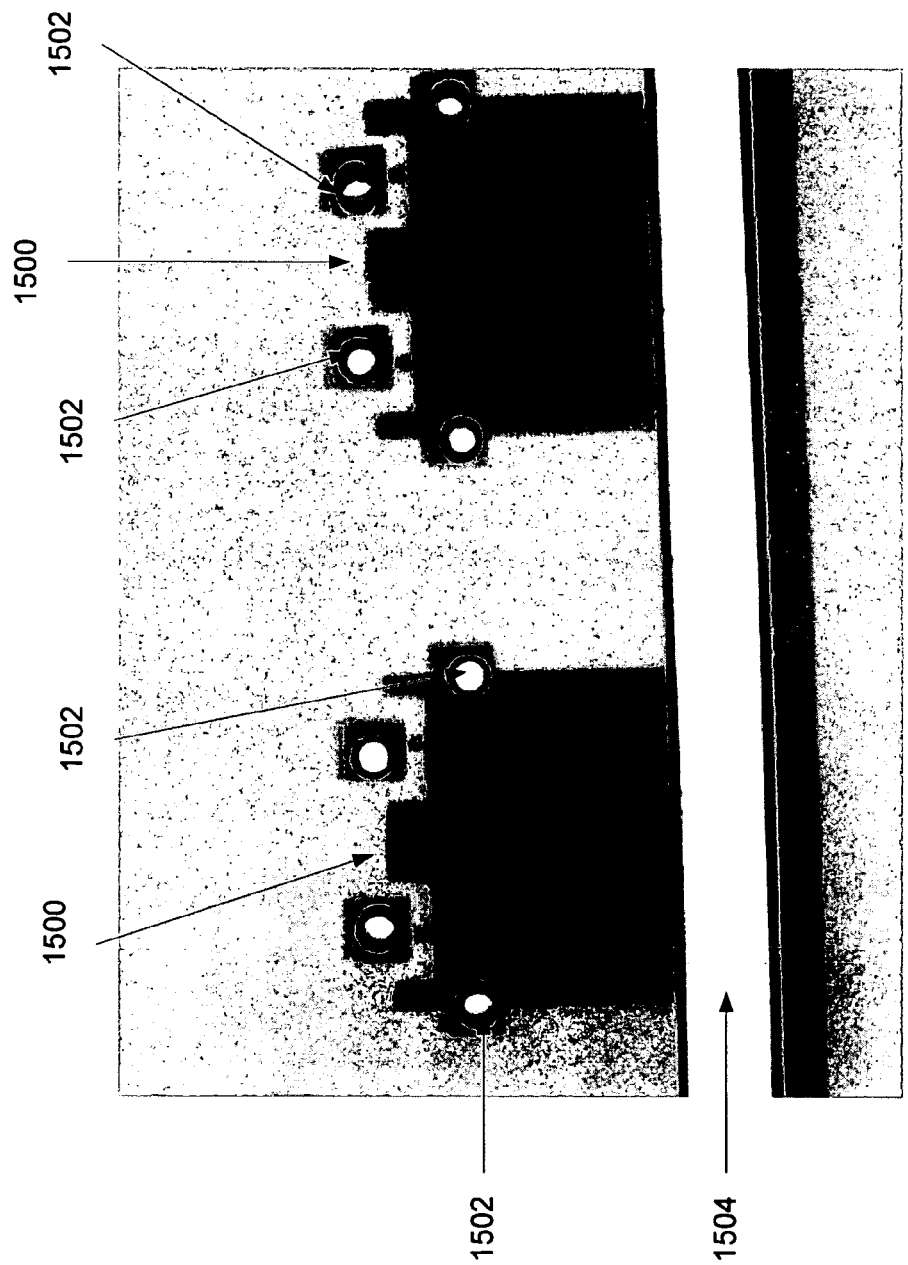

FIG. 15 illustrates a top perspective view of a module with shielding using plated slots or trenches along the periphery of the module.

Figure 16:
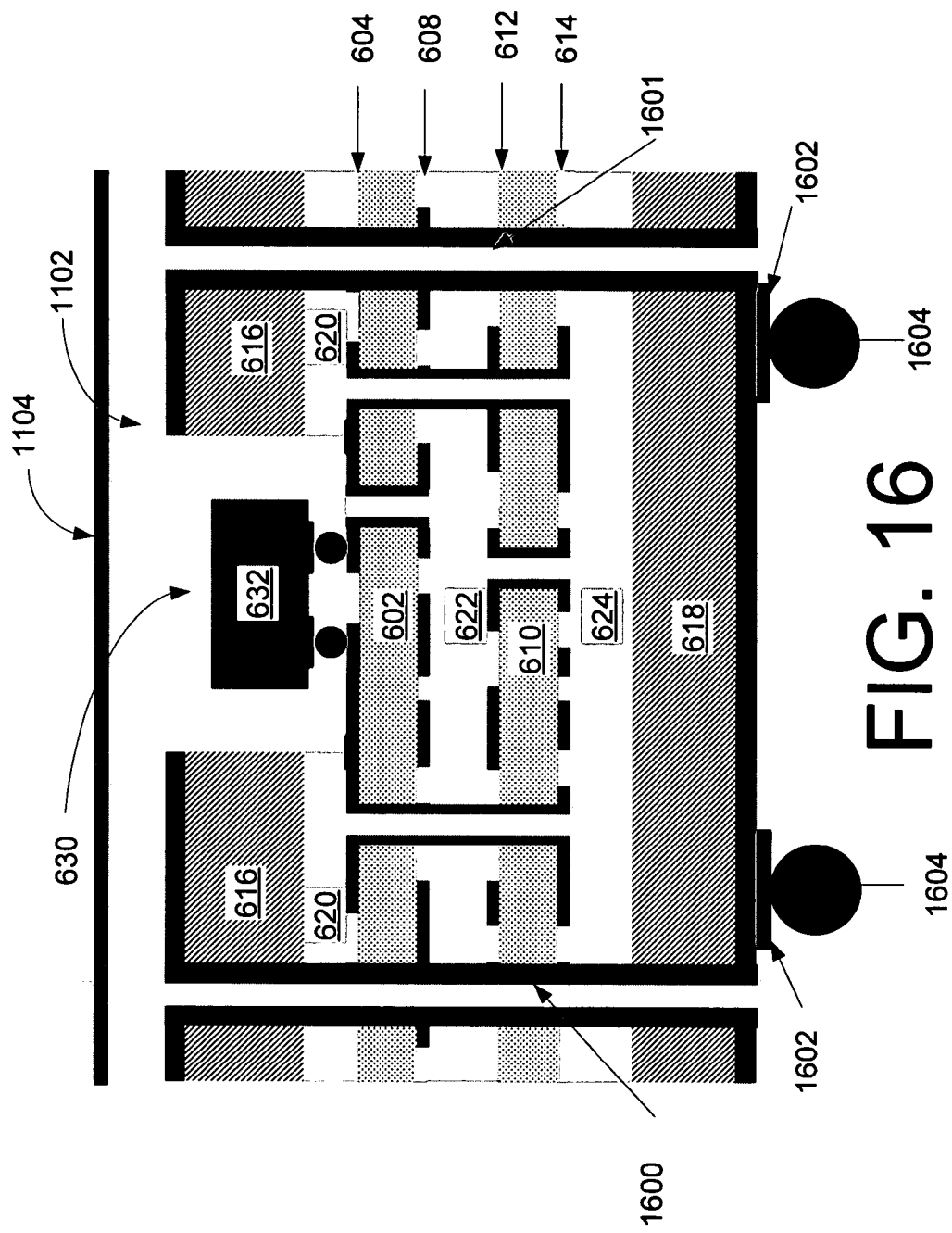

FIG. 16 illustrates an exemplary package for the multi-layer stack up structure.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

According to an embodiment of the invention, an exemplary heterogeneous organic materials structure will now be described with reference to FIG. 1A. The outer layers 102, 104 of the stack up 100 may include thermoplastics such as Rogers 4350 or Rogers 4003, liquid crystalline polymer (LCP), or other organic material such as hydrocarbon, Teflon, epoxy, or polyimide. The Rogers material is available from the Rogers Corporation headquartered in Rogers, Conn. In addition, the outer layers 102, 104 may be other low dielectric constant, low-loss glass, ceramic, or fiber reinforced organic material. According to an exemplary embodiment, the outer layers 102, 104 may have electrical properties where the dielectric constant is approximately 3.1 or less and the dielectric loss is approximately 0.004 or less for particular applications, including high frequency RF (radio frequency) applications. Further, the outer layers 102, 104 may form the packaging of the RF device and include several metal layers.

Figure 1A:
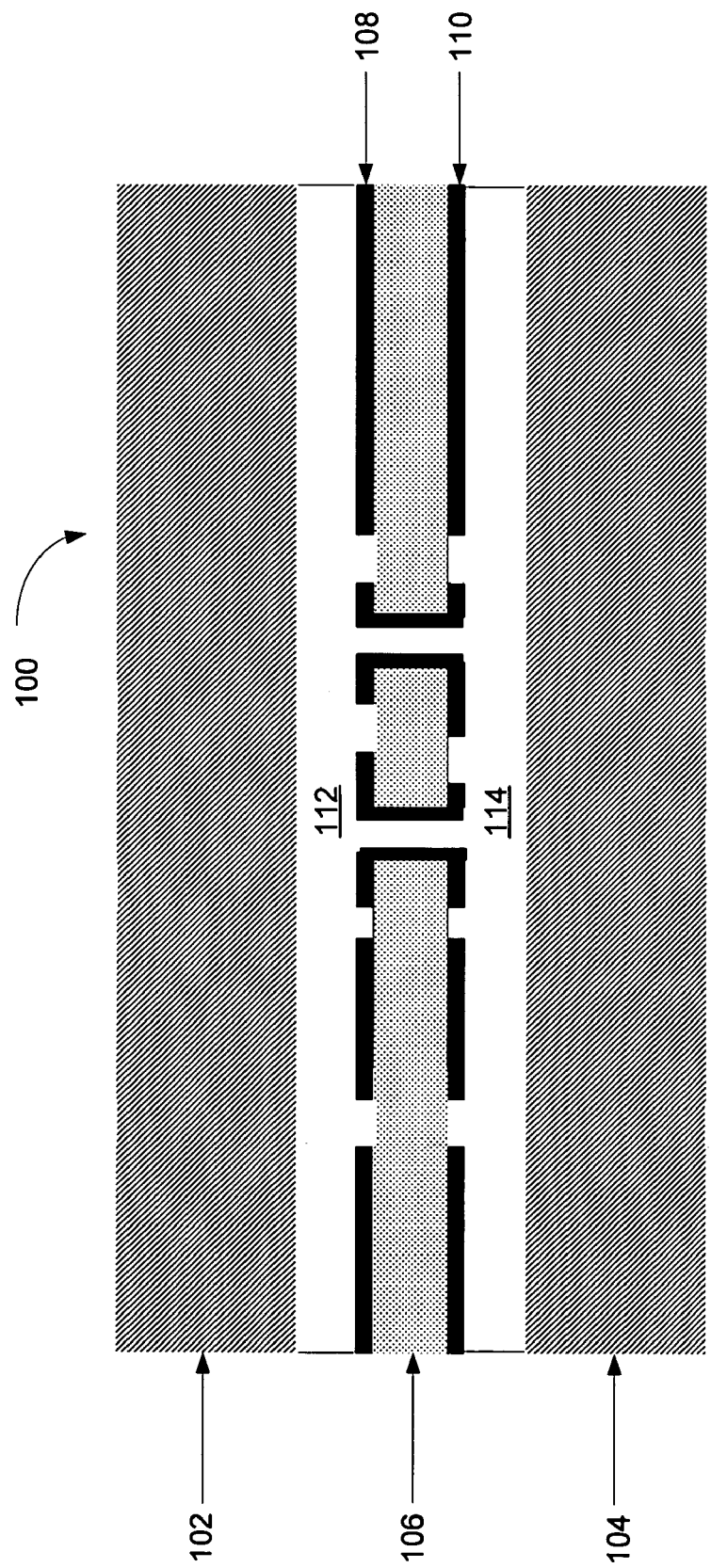

Still referring to FIG. 1A, the one or more inner core layers 106 positioned between the outer layers 102, 104 may include one or more layers of liquid crystalline polymers (LCP), bromine-free material laminated to LCP, or organic layers with high K material as described in published U.S. patent application Ser. No. 10/402,315, filed Mar. 28, 2003, and entitled "Methods for Fabricating Three-Dimensional All Organic Interconnect Structures." In alternative embodiments, the inner core layers 106 may also include thermoplastics such as Rogers 4350 or Rogers 4003 material. Other thermoplastic inner core layer 106 materials other than those described above may be utilized, including polyphenylene sulfide resins, polyethylene terephthalate resins, polybutylene terephthalate resins, polyethylene sulfide resins, polyether ketone resins, polytetraflouroethylene resins and graft resins, or similar low dielectric constant, low-loss organic material. According to an exemplary embodiment, the inner core layers 106 may have a dielectric constant of approximately 3.1 or less and a dielectric loss of approximately 0.004 or less for particular applications, including high frequency RF applications. In addition, the thickness of each inner core layer 106 may be less than approximately 0.004 mils in particular applications.

The inner core layers 106, which may be metal (e.g., copper, aluminum, silver, gold, or other high conductivity material) cladded or uncladded, may serve as a basis for the fabrication of passive elements such as the inductors, capacitors, and matching network structures that serve to make up the baluns, diplexers, duplexers, filters (e.g., high, low pass, and/or bandpass), and the like when the metal layers 108, 110 are circuitized. According to an exemplary embodiment, the photo lithographic techniques may be utilized to circuitize metal layers 108, 110. The photolithographic techniques can be additive, semi-additive, subtractive in nature, or a combination thereof. The inductors and capacitors may be fabricated by defining circuitry on the top and bottom metal layers 108, 110 of the diclad (e.g., double sided metal such as copper) inner core layer 106 and then interconnected by means of a z-axis connection which can be fabricated by means of laser ablation, mechanical drilling, mechanical punching, plasma drilling, or wet etching followed by metal deposition either by plating, screen printing of conductive paste or vacuum deposition of an appropriate conductor metal such as copper, aluminum, silver, gold, and the like.

According to an exemplary embodiment, the outer layers 102, 104 and/or inner layers 112, 114 of the stack up 100 may be circuitized individually and in a parallel nature and subsequently laid up and joined together using bond ply or prepreg layers 112, 114 (e.g., Rogers 4450 bond ply). According to an illustrative embodiment, the bond ply or prepreg layers 112, 114 may have a dielectric constant of less than approximately 3.1 and a dielectric loss of less than approximately 0.004 in order for particular designs to operate as a high frequency component and package.

While only one inner core layer 106 is illustrated in FIG. 1A, it will be readily apparent to one of ordinary skill in the art that a plurality of inner core layers may be utilized between the outer layers 102, 104 as necessary. For example, FIG. 1B illustrates inner core layers 124 and 128 disposed between outer layers 120 and 122. The inner core layers 124, 128 may be LCP while the outer layers 120, 122 may be Rogers 4450 according to an exemplary embodiment. Each inner core layer 124, 128 may include metal layers 125, 126 and metal layers 129, 130, respectively. Further, adhesive layers 132, 134, 136 of prepreg or bond ply may be disposed between the inner core layers 124, 128 and outer layers 120, 122 as shown in FIG. 1B.

In an alternative embodiment, the inner core layers can also include copper foils or other metal planes bonded by prepreg, bond ply, or other thermosetting polymer on both sides of the foil. FIG. 1C illustrates metal plane 140 and inner core layers 142, 146 disposed between outer layers 136, 138. The metal plane 140 may be a copper foil core, and the inner core layers 142, 146 may be LCP according to an illustrative embodiment. In addition, the outer layers 136, 138 may be Rogers 4350, Rogers 4003, or other thermoplastics. The metal plane 140 may include layers 150, 152 on each side. The layers 150, 152 may be prepreg, bond ply, or other thermosetting polymer including epoxy resins, phenolic resins, unsaturated polyester resins, phenolic resins, unsaturated polyester resins, polyimide resins, cyanate resins, polyphenylene ether resins, furmate resins, and polybutadiene resins. In addition, bond ply or prepreg layers 154, 156 may be disposed between outer layers 136, 138 and the corresponding inner layers 142, 146.

In another alternative embodiment, a rigid core may be utilized as illustrated in FIG. 1D. In FIG. 1D, the inner core layers 174, 176, 178 are disposed between the outer layers 170, 172. The one or more of the inner core layers (e.g., layers 174, 178) may be LCP while the one or more inner core layer (e.g., layer 176) may be of a rigid core material such as Rogers 4350, Rogers 4003, or other thermoplastics. The outer layers 170, 172 may be materials such as Rogers 4350, Rogers 4003, or other thermoplastics. In addition, adhesive layers 188, 190, 192, 194, 196 of bond ply or prepreg (e.g., Rogers 4450 prepreg) may be disposed between the inner core layers 174, 176, 178 and outer layers 170, 172 as shown in FIG. 1D.

One of ordinary skill will recognize that the embodiments described above are exemplary in nature and additional variations, more complex stack ups, and multi-layer structures may be readily constructed with a combination of the LCP, thermoplastics, rigid cores, metal foils, organic layers with high K material, and other organic material as described above that are bonded together using appropriate bond ply, prepregs, or other adhesives.

Multi-Layer Stack Ups Incorporating Discrete Devices and/or Components

Using any of the embodiments described above and other possible stack up combinations as described, the multi-layer organic laminates may be used to embed discrete active and passive devices. The discrete devices may include oscillators, amplifiers, capacitors, and other devices including RF devices. These discrete devices may be embedded within the organic laminate structures as described below.

A. Embedded Devices

Surface mount devices, which may also include flip chips, are embedded in a module stack up via the following exemplary process. Referring to FIG. 2, a inner core layer 202 with metal layers 204, 206 on each side is illustrated. One or more vias 216 may also be disposed within core layer 202 to connect metal layers 204 and 206. According to an exemplary embodiment, the inner core layer 202 is a film of LCP and the metal layers 204, 206 are copper such that a copper clad LCP film is formed. The copper clad LCP film may be circuitized using a print and etch process or any of the other processes described previously. Upon circuitization, the devices can be mounted on the copper clad LCP film either via solder, alloy attach, or other conductive adhesive attach. Referring to FIG. 2, the leads 220 of surface mount devices 208, 209 may be connected to the metal layers 204 and 206, respectively, using solder, alloy attach, or other conductive adhesive attach 210. Likewise, a flip chip 212 may also may be attached to metal layer 204 (or metal layer 206) through solder balls, alloy attach, or other conductive adhesive attach 214.

FIG. 3 illustrates an alterative embodiment of the structure described above with reference to FIG. 2. Referring to FIG. 3, in the alternative embodiment, a solder, alloy attach, or other conductive adhesive attach is not utilized with surface mount components. Instead a non-conductive polymer attach 318 (e.g., perhaps a non-conducting epoxy) may be used to secure the surface mount devices 208, 209 to the inner core layer 202. In such as case, the leads 220 of surface mount devices 208, 209 would be in contact with connections or pads formed on metal layers 208 and 209, respectively, as shown in FIG. 3.

Once the surface mount devices (e.g., surface mount devices 208, 209 and flip chip 212) have been attached, they can be embedded in a laminate stack up, as illustrated in FIG. 4A. The embedding of one or more of the devices 208, 209, and 212 may be accomplished by lamination of the inner core layer 202 to the outer layers 430 and 432 using a bond ply or prepreg layers 434, 436 such that the layers 434, 436 encapsulate the surface mount devices 208, 209 and flip chip 212. This lamination occurs at a temperature lower than that utilized for the solder, alloy attach, or other conductive adhesive attach 210 utilized for the surface mount device 208 and the solder balls, alloy attach, or conductive adhesive attach 214 utilized for flip chip 212 in FIG. 4A. In addition, this lamination also occurs at a temperature lower than that utilized with the non-conductive polymer attach 318 utilized with surface mount component 209. The may be achieved by using lower temperature bondply or prepreg layers 434, 436 compared to the inner core layer 202, the outer layers 430, 432, and the attachment means for the surface mount device 208.

FIG. 4B illustrates an alternative stack up according to an embodiment of the present invention. FIG. 4B shows inner layers 450, 456, which may be LCP according to an exemplary embodiment. Inner layer 456 may include a cavity 451 that is drilled to a controlled depth using one of a variety of methods known to those of ordinary skill in the art, including laser ablation, mechanical drilling, mechanical punching, or wet etching. Inner layer 450, 456 may also be provided with metal layers 452, 454 and metal layers 458, 460, respectively. The metal layers 452, 454, 458, 460 may be patterned or circuitized to form one or more passive circuits. Metal layers 452 and 454 may have at least two different capacitances due to the wider spacing on the outer walls of cavity 451 and narrower spacing under the walls of cavity 451. In addition, a flip chip 472 (or other surface mount component) may be positioned within the cavity 451 such that the flip chip 472 is in communication with pads or connections on the metal layer 452. After the flip chip 472 has been attached, the multi-layer structure may be fabricated by disposing inner layers 450, 456 between outer layers 462, 464 along with bondply or prepreg layers 466, 468, and 470 as illustrated in FIG. 4B. One of ordinary skill in the art will readily recognize that while two inner layers 450, 456 are illustrated in the exemplary embodiment, there may be less than or more than two inner layers. For example, another embodiment may only include inner layer 450. Alternatively, additional inner layers may be added as necessary. Many modifications are readily apparent to one of ordinary skill in the art. For example, instead of drilling the cavity on inner layer 450, a cavity may instead be drilled above the attached flip chip 472 in the inner surface of outer layer 462. Upon lamination, the flip chip 472 would be encapsulated at least in part by an interior cavity in outer layer 462. Many variations will be known to one of ordinary skill in the art.

According to an alternative embodiment of the invention, as shown in FIG. 5A, the attachment material 502 for surface mount devices 208, 209 may be of the same curing temperature as the material shown in bond ply or prepreg layers 434 and 436. In this embodiment, both the bond ply or prepreg layers 434, 436 and the component attachment material 502 can both cure at the same temperature, thereby providing a highly reliable contact between the leads of the surface mount components 208, 209 and the copper pads of metal layers 204, 206. Thus, no additional parasitics are introduced at this metal to metal interface. According to one exemplary embodiment, the curing of the prepreg layers 434, 436 and component attachment material 502 may occur in the same step. In addition, in particular embodiments, the component attachment material 502 may be the same material utilized for bond ply or prepreg layers 434, 436.

Still referring to FIG. 5A, the circuit may be completed as needed by interconnecting the surface mount devices 208, 209, which may include flip chips, through plated through holes, such as one or more of the through holes 504, 506, 508, and 510. Alternatively, referring to FIG. 5B, circuit may be completed as needed by interconnecting the surface mount devices 208, 209, which may include flip chips, through vias, such as one or more of the vias 512, 514, 516, and 518. The vias 512, 514, 516, and 518 may be blind microvias according to an aspect of the invention. One of ordinary skill in the art will readily recognize that the approaches in FIGS. 5A and 5B may be combined for the same multi-layer structure. The plated through holes 504, 506, 508, 510 in FIG. 5A and the vias 512, 514, 516, and 518 in FIG. 5B may be fabricated by means of laser ablation, mechanical drilling, mechanical punching, plasma drilling, or wet etching followed by metal deposition either by plating, screen printing of conductive paste or vacuum deposition of an appropriate conductor metal such as copper, aluminum, silver, gold, or the like. The metal deposition process may also involve desmearing or plasma approaches followed by catalysation and electroless copper in the through hole.

While FIGS. 5A and 5B utilized plated through holes and vias to provide interconnections to surface mount components (such as flip chips) that were attached using a particular means of attachment, the plated through holes and vias are generally applicable to any of the surface mount components that are attached using other means as previously described. One of ordinary skill in the art will readily recognize that additional devices can be integrated and/or embedded via the above-described process by repeating the sequences described for a multiplicity of layers.

B. Cavities

In addition or in the alternative to the embedding described above, cavities may be formed in the multi-layer organic laminates according to an embodiment of the invention. These cavities may be utilized for embedding active and discrete components and devices. These discrete components and devices may be surface mount devices, flip chips, or wire bonded dies.

FIG. 6A illustrates an exemplary stack up with a cavity 630 according to an embodiment of the invention. FIG. 6A illustrates inner core layers 602, 610, which may be LCP, bromine-free material laminated to LCP, organic layers with high K material, Rogers 4350, Rogers 4003 material, and other theremoplastic materials such as polyphenylene sulfide resins, polyethylene terephthalate resins, polybutylene terephthalate resins, polyethylene sulfide resins, polyether ketone resins, polytetraflouroethylene resins and graft resins, or similar low dielectric constant, low-loss organic material. Each of the inner core layers 602, 610 may include metal layers 604, 608 and metal layers 612, 614, respectively. The metal layers 604, 608, 612, 614 may be patterned or circuitized to form one or more passive circuits or a portion thereof. The outer layers 616, 618 may include thermoplastics such as Rogers 4350 or Rogers 4003, liquid crystalline polymer (LCP), or other organic material such as hydrocarbon, Teflon, epoxy, or polyimide. In addition, the outer layers 616, 618 may be other low dielectric constant, low-loss glass, ceramic, or fiber reinforced organic material. In addition, layers 620, 622, 624 of bond ply or prepreg material may be disposed between the outer layers 616, 618 and inner core layers 602, 610 as illustrated in FIG. 6A. The bond ply or prepreg material may be Rogers 4450 prepreg according to an illustrative embodiment. One of ordinary skill in the art will recognize that the stack up of the outer and inner core layers are exemplary in nature, and can be readily modified as described previously.

Still referring to FIG. 6A, a cavity 630 is formed within the outer layer 616 and the bond ply or prepreg layer 620. According to an exemplary embodiment, the outer layer 616 may be LCP, thermoplastics such as Rogers 4350 or Rogers 4003, other organic materials, or alternatively, a plurality of layers of LCP, thermoplastics such as Rogers 4350 or Rogers 4003, and other organic materials. If a plurality of layers are utilized for the outer layer 616, then additional layers of bond ply or prepreg may be utilized. According to an exemplary embodiment, the outer layer 616 may be precut or preformed such as to create a cavity 630 during lamination of the multi-layer stack up structure. Alternatively, a cavity 630 may be fabricated in the outer layer 616 and prepreg layer 620 following lamination of the stack up structure by means laser ablation, mechanical drilling, mechanical punching, plasma drilling, reactive ion etch (RIE), wet etching, and the like. The depth of the cavity 630 and the layers through which it extends may be controlled utilizing the above processes, as understood by one of ordinary skill in the art.

FIG. 6B illustrates an alternative embodiment to the structure shown in FIG. 6A. In FIG. 6B, metal shielding 640, 642 may be provided on one or more walls of the cavity 630. The metal shielding 640, 642 may be a variety of conductive materials, including copper, gold, silver, aluminum, alloys, and the like. According to an exemplary embodiment, the metal shielding 640, 642 may be circuitized or patterned to form one or more circuits, or portions thereof. While FIGS. 7A-13 may not explicitly indicate metal shielding 640, 642, it will be apparent to one of ordinary skill in the art that such metal shielding may be provided on one or more walls of the cavity 630 if desired.

Once the cavity 630 has been formed in the multi-layer stack up, then a discrete device, either active or passive, may be positioned within the cavity 630. Referring again to FIGS. 6A and 6B, a surface mount component or a flip chip 632 may be connected to the metal layer 604. In the alternative, as shown in FIG. 7A, a wire-bonded die 734 may be placed in the cavity 630 instead of a surface mount component or flip chip such that the wires 740 of the wire bonded die 734 are in communication with the metal layer 604. Additionally, referring to FIG. 7B, the wires 740 of the wire bonded die 734 may instead be in communication with the top metal layer. One of ordinary skill in the art will readily recognize that a combination of FIGS. 7A and 7B are possible such that one or more wires 740 are in communication with the metal layer 604 while one or more wires 740 are in communication with the top metal layer.

After the surface mount component, flip chip, or wire bonded die has been positioned with the cavity 630 as shown in FIGS. 6A, 6B, and 7, a cap may be provided for hermetic encapsulation to protect the discrete device from moisture and/or for heat dissipation from the discrete device. A variety of caps and lids may be utilized as will be described next.

1. Metal Caps

FIG. 8 illustrates a metal cap or lid 802 according to an embodiment of the invention. The metal cap or lid 802 may include one or more of a variety of metals, including one or more of iron, nickel, cobolt, silver, steel, aluminum, alloy, or a combination thereof. The metal cap or lid 802 is placed over the cavity 630 to encapsulate the flip chip 632 (or other surface mount device or wire bonded die) and is attached to the surface of the multi-layer structure through non-conductive adhesives 804. Non-conductive adhesives 804 may include a non-conducting epoxy. In addition, a thermal conduction medium or thermal conductor 806 may be disposed between the flip chip 632 and metal cap or lid 802 to facilitate the dissipation of heat from the flip chip 632. Examples of thermal conduction mediums or thermal conductors 806 may include thermal grease and copper slugs. Metal caps or lids 802 may be utilized with high heat thermal density surface mount components, which include flip chips 632, or where heat dissipation is desired.

2. Caps with Preforms

FIG. 9 illustrates a cap 902 with preforms 904 according to an embodiment of the invention. The cap 902 may be formed of metal, including aluminum, steel, and alloys. The preforms 904 may be solder, alloy attach, or other conductive adhesive. When the cap 902 with preforms 904 is placed over the cavity 630 and laminated, the preforms 904 adhere to the surface of the multi-layer structure, thereby encapsulating the flip chip 632 (or other surface mount device or wire bonded die). In addition, a thermal conduction medium or thermal conductor 806 may be disposed between the flip chip 632 and cap 902 to facilitate the dissipation of heat from the flip chip 632. Examples of thermal conduction mediums or thermal conductors 806 may include thermal grease and copper slugs. Caps 902 may be utilized with high heat thermal density surface mount components, which include flip chips 632.

In addition, a metal layer (e.g., copper, silver, gold, aluminum, alloy, and the like) may optionally be provided on the exterior surface of the cap 902 to provide enhanced heat dissipation properties for the encapsulated component.

3. Encapsulate

FIG. 10 illustrates an encapsulant or encapsulate 1002 utilized with an encapsulation process for cavity 630 according to an embodiment of the invention. The encapsulate 1002 may include a variety of types of molded plastic. When the encapsulate 1002 is placed over the cavity 630 and laminated, it adheres to the surface of the multi-layer structure, thereby encapsulating the cavity 630 and protecting the flip chip 632 (or other surface mount device or wire bonded die).

4. Laminate with Single-Sided Copper

FIG. 11 illustrates an organic laminate 1102 with a metal layer 1104 according to an embodiment of the invention. The organic laminate 1102 may be a no-flow or a low-flow prepreg and the metal layer 1104 may be copper, silver, aluminum, gold, alloys, and other conductive materials. When the organic laminate 1102 with the metal layer 1104 is placed over the cavity 630 and laminated, the organic laminate 1102 adheres to the surface of the multi-layer structure. Because the organic laminate 1102 may be no-flow or low-flow prepreg, the integrity of the cavity 630 is maintained and is not filled by the prepreg.

FIG. 12 illustrates an exemplary embodiment where the metal layer 1104 shown in FIG. 11 may be circuitized to form a circuitized metal layer 1202. Such circuitization of the metal layer provides for enchanced flexibility and routability. In addition, interconnects or vias 1204 may be formed in the organic laminate 1102 to connect the metal layer 1202 with the surface of the multi-layer structure, which may also be circuitized. According to an exemplary embodiment, the interconnects or vias 1204 may be blind microvias.

5. Filled Cavities

FIG. 13 illustrates a cavity 630 that is filled according to an embodiment of the present invention. In FIG. 13, a fast flow prepreg 1302 is placed over the cavity 630. During a lamination process, the cavity 630 is filled by the fast flow prepreg 1302. The filled cavity 630 thus encapsulates the flip chip 632 (or other surface mount component) positioned within the cavity 630. In addition, the fast flow prepreg 1302 may optionally be cladded on the exterior surface with a metal layer. The metal layer may be copper, silver, aluminum, gold, alloys, or other conductive material.

Shielding of the Multi-Layer Stack Ups

An aspect of the multi-layer structure (e.g., an RF component) is the means by which it is shielded. Shielding may be necessary to minimize spurious radiation from surrounding electrical components that could cause detrimental effects on the performance of an RF component or device. Shielding may be performed post process in that the shielding of the device may be performed after it has been fabricated and joined to the printed circuit card. When a device is shielded, it may be done using metal or ceramic housing/sheathing which is placed around the device. This housing or sheathing may be referred as a "can."

In addition to post-process shielding of a multi-layer structure, in-built shielding may also be incorporated within the RF device or component. With multi-layer structures in accordance with an embodiment of the invention, the in-built shield may be accomplished as the same time the plated through holes (see e.g., FIGS. 1B-1D and FIG. 5A) are fabricated or perhaps afterwards.

The exemplary embodiment where the shielding may be performed during the formation of the plated through holes will now be discussed in more detail. According to this exemplary embodiment, plated through holes are created or drilled not only for external interconnections but also along the perimeter or side of the device 1400 to form a wall or array of vias 1402 ("via wall" or "fence") as illustrated in a top perspective view shown in FIG. 14. The shielding is then accomplished post-metallization of the through holes and via wall 1402 which has exposed the sidewalls of the device for metallization. The sidewall metal coverage may be robust with plating as opposed to line of sight metallization techniques such as evaporation or sputtering. The via wall 1402 may be connected to ground layers or planes on one or both surfaces of the device 1400.

The exemplary embodiment where shielding is performed after the formation of the plated through holes will now be discussed in more detail. According this exemplary embodiment shown in the top perspective view of FIG. 15, the device 1500 may be slotted along the edges opposite the IO (input/output) connections of the plated through holes 1502 to form a plated slot or trench 1504. The slotting or trench 1504 may be accomplished using a mechanical drill bit or laser that cuts along the edges and through the cross-section of the device 1500, thereby exposing its sidewalls. The shielding is then accomplished post metallization of the through holes 1502 and sidewall of the slot or trench 1504 of the device 1500. The sidewall metal coverage may be very robust with plating as opposed to line of sight metallization techniques such as evaporation or sputtering. The sidewall of the trench 1504 may be connected to ground layers or planes on one or both surfaces of the device 1500.

Packaging the RF Multi-Layer Device

FIG. 16 illustrates an exemplary embodiment for a ball-grid array package for the multi-layer structure similar to that shown in FIG. 11. In FIG. 16, the multi-layer device utilizes plated through holes 1600, 1601 through the entire cross-section of the package post lamination. The plated through holes 1600, 1601 may be fabricated either by a mechanical drill, a laser drill, plasma drilling, or mechanical punch. The plated through holes may be metallized using either standard PCB (printed circuit board) desmearing or plasma approaches followed by catalysation and electroless copper in the through hole. The package may subsequently circuitized on the outer layers to form appropriate ground and power circuits. The next step may involve a redistribution layer, which is formed using a resin coated foil of poly phenol ether (e.g., APPE), LCP, or single copper cladded Rogers 4450. This layer is circuitized followed by solder mask to define the IO terminal pads 1602. An appropriate finish metal of NiAu, Cu, or Sn is deposited on the IO terminal pads 1602. The ball grid array may be formed by screen printing of the solder paste followed by solder reflow to form the solder balls 1604.

In alternative embodiments, the solder balls 1604 may be omitted in order to form a land-grid array. Similarly, the device may alternatively be packaged as a surface mount device. Other packages will readily be known to one of ordinary skill in the art.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in generic and descriptive sense only and not for purposes of limitation.

That which is claimed:

1. A multi-layer organic stack up, comprising:
    a first organic layer;
    a circuitized conductive layer on a surface of the first organic layer for forming passive circuits;
    a second organic layer positioned opposite the circuitized conductive layer, wherein the second organic layer is coupled to the first organic layer with a layer of prepreg;
    a top metal layer that acts as an outer surface of the multi-layer organic stack up;
    a cavity defined by one or more walls formed by at least one of the second organic and the prepreg layer, wherein the cavity exposes at least a portion of the circuitized conductive layer;
    a discrete device attached to the circuitized conductive layer in the cavity; and
    a laminate cap attached to the top metal layer and substantially covering the cavity;
    wherein the laminate cap is configured such that the cavity is not filled by the laminate cap; and
    wherein at least one of the one or more walls of the cavity include metal shielding, and wherein the metal shielding is circuitized.

2. The multi-layer organic stack up of claim 1, further comprising a metal layer substantially covering the laminate cap.

3. The multi-layer organic stack up of claim 2, wherein the metal layer is circuitized.

4. The multi-layer organic stack up of claim 1, wherein the discrete device is attached to the circuitized conductive layer at least in part by one of wire bond and solder.

5. The multi-layer organic stack up of claim 1, further comprising a thermal conductor that provides thermal conductivity between the discrete device and the laminate cap.

6. A multi-layer organic stack up, comprising:
    a first organic layer;
    a circuitized conductive layer on a surface of the first organic layer for forming passive circuits;
    a second organic layer positioned opposite the circuitized conductive layer, wherein the second organic layer is coupled to the first organic layer with a layer of prepreg;
    a top metal layer that acts as an outer surface of the multi-layer organic stack up;
    a cavity defined by one or more walls formed by at least one of the second organic and the prepreg layer, wherein the cavity exposes at least a portion of the circuitized conductive layer;
    a discrete device attached to the circuitized conductive layer in the cavity; and
    a laminate cap attached to the top metal layer and substantially covering the cavity;
    wherein the laminate cap is configured such that the cavity is not filled by the laminate cap; and
    further comprising a metal layer substantially covering the laminate cap; and
    wherein the metal layer is circuitized;
    wherein at least one of the one or more walls of the cavity include metal shielding, and wherein the metal shielding is circuitized; and
    wherein the circuitized metal layer is conductively connected to the circuitized metal shielding.

7. The multi-layer organic stack up of claim 6, wherein the circuitized metal shielding is conductively connected to the circuitized conductive layer.

8. A multi-layer organic stack up, comprising:
    a first organic layer;
    a circuitized conductive layer on a surface of the first organic layer for forming passive circuits;
    a second organic layer positioned opposite the circuitized conductive layer, wherein the second organic layer is coupled to the first organic layer with a layer of prepreg;
    a top metal layer that acts as an outer surface of the multi-layer organic stack up;
    a cavity defined by one or more walls formed by at least one of the second organic and the prepreg layer, wherein the cavity exposes at least a portion of the circuitized conductive layer;
    a discrete device attached to the circuitized conductive layer in the cavity; and
    a molded plastic encapsulate attached to the top metal layer and substantially covering the cavity;
    wherein the molded plastic encapsulate is configured such that the cavity is not filled by the molded plastic encapsulate; and
    wherein at least one of the one or more walls of the cavity include metal shielding, and wherein the metal shielding is circuitized.

* * * * *